(12) United States Patent
Sakemi et al.

(10) Patent No.: US 11,468,248 B2
(45) Date of Patent: Oct. 11, 2022

(54) SEMICONDUCTOR DEVICE

(71) Applicants: NEC CORPORATION, Tokyo (JP);
The University of Tokyo, Tokyo (JP)

(72) Inventors: Yusuke Sakemi, Tokyo (JP); Takashi Kohno, Tokyo (JP)

(73) Assignees: NEC CORPORATION, Tokyo (JP);
THE UNIVERSITY OF TOKYO, Tokyo (JP)

(*) Notice: Subject to any disclaimer, the term of this patent is extended or adjusted under 35 U.S.C. 154(b) by 586 days.

(21) Appl. No.: 16/500,996

(22) PCT Filed: Apr. 3, 2018

(86) PCT No.: PCT/JP2018/014251
§ 371 (c)(1),
(2) Date: Oct. 4, 2019

(87) PCT Pub. No.: WO2018/186390
PCT Pub. Date: Oct. 11, 2018

(65) Prior Publication Data
US 2020/0034577 A1 Jan. 30, 2020

(30) Foreign Application Priority Data
Apr. 7, 2017 (JP) .............................. JP2017-077164

(51) Int. Cl.
*H03F 3/45* (2006.01)
*H01L 21/822* (2006.01)
(Continued)

(52) U.S. Cl.
CPC ............. *G06G 7/60* (2013.01); *G06N 3/0635* (2013.01); *H01L 21/822* (2013.01); *H01L 27/04* (2013.01); *H01L 28/40* (2013.01); *H03F 3/45071* (2013.01)

(58) Field of Classification Search
CPC ...... G06G 7/60; G06N 3/0635; G06N 3/0481; H01L 21/822; H01L 27/04; H01L 28/40; H03F 3/45071
(Continued)

(56) References Cited

U.S. PATENT DOCUMENTS 5,148,514 A * 9/1992 Arima .................... G06N 3/063
708/801
10,732,933 B2 * 8/2020 Choi ........................ H03K 3/84

FOREIGN PATENT DOCUMENTS

JP 02-287670 A 11/1990
JP 07-093277 A 4/1995
(Continued)

OTHER PUBLICATIONS

Takashi Kohno et al., "A Qualitative-Modeling-Based Low-Power Silicon Nerve Membrane," International Conference on Electronics, Circuits and Systems, ICECS, 2014, pp. 199-202.
(Continued)

*Primary Examiner* — Hieu P Nguyen
(74) *Attorney, Agent, or Firm* — Sughrue Mion, PLLC

(57) ABSTRACT

Input unit to which a voltage is applied, current output unit that outputs a high level current or a low level current in response to the voltage applied to input unit, and stochastic circuit unit that, in response to the voltage applied to input unit, changes a probability that the high level current or the low level current is output from current output unit, in accordance with a sigmoid function used in a mathematical model of a neural activity are included.

10 Claims, 31 Drawing Sheets

(51) Int. Cl.
*H01L 27/04* (2006.01)
*G06G 7/60* (2006.01)
*G06N 3/063* (2006.01)
*H01L 49/02* (2006.01)

(58) Field of Classification Search
USPC .................................................. 330/250, 261
See application file for complete search history.

(56) References Cited

FOREIGN PATENT DOCUMENTS

| | | |
|---|---|---|
| JP | 10-065124 A | 3/1998 |
| JP | 2001-034735 A | 2/2001 |
| JP | 2005-245177 A | 9/2005 |
| JP | 2008-034667 A | 2/2008 |
| JP | 2016-051491 A | 4/2016 |
| JP | 2016-051811 A | 4/2016 |

OTHER PUBLICATIONS

K. Murali et al., "Reliable Logic Circuit Elements that Exploit Nonlinearity in the Presence of a Noise Floor," Physical Review Letters, Mar. 13, 2009, pp. 104101-1-104101-4, vol. 102.
International Search Report of PCT/JP2018/014251 dated Jun. 12, 2018.

* cited by examiner

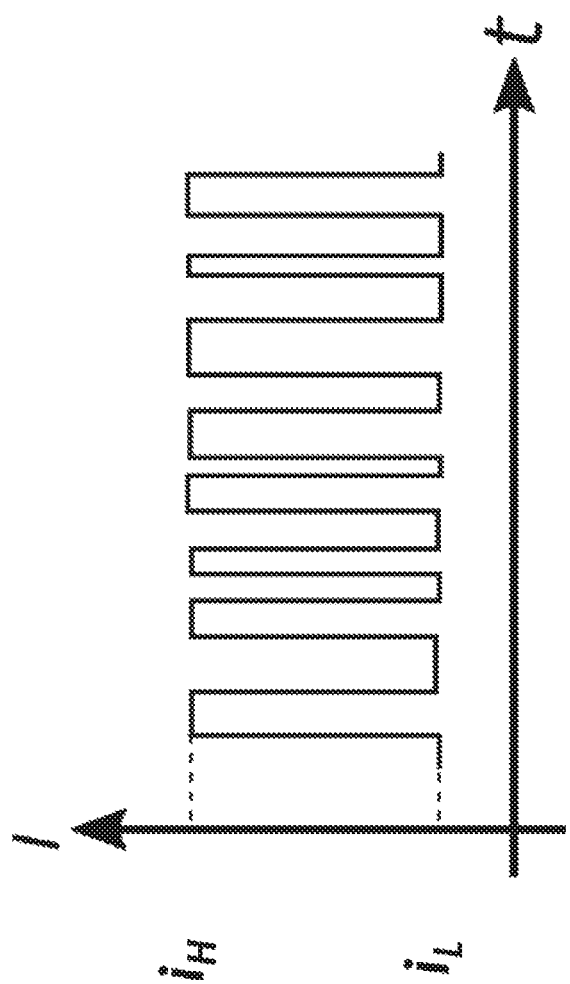

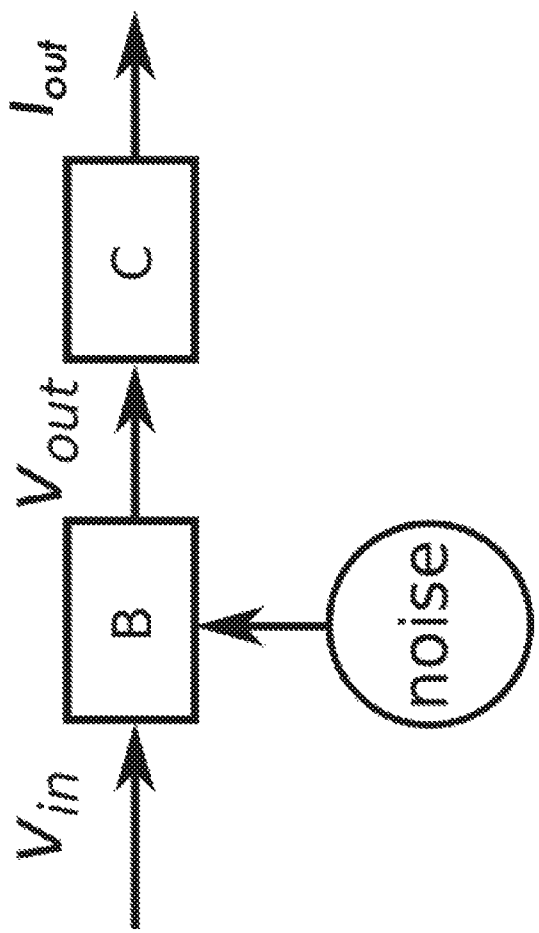

SEMICONDUCTOR DEVICE

CROSS REFERENCE TO RELATED APPLICATIONS

This application is a National Stage of International Application No. PCT/JP2018/014251 filed Apr. 3, 2018, claiming priority based on Japanese Patent Application No. 2017-077164 filed Apr. 7, 2017, the disclosure of which are incorporated herein in their entirety by reference.

TECHNICAL FIELD

The prevent invention relates to semiconductor devices and, more particularly, to a semiconductor device capable of being used as a constituent element of a neuromorphic analogue circuit.

BACKGROUND ART

A neuromorphic system means an information processing system having been established by obtaining hints from, or imitating, information processing in a cranial nerve system. Through the use of the neuromorphic system, it is expected that information processing that is difficult for existing digital computers is efficiently executed.

A silicon neural network, one of the neuromorphic systems, is a circuit for reproducing an electrophysiological activity of a neural network. The silicon neural network is a network resulting from coupling of a large number of silicon neuron circuits via silicon synapse circuits. By building an electronic circuit version neural network, the silicon neural network is capable of reproducing electrical activities equivalent to those of the neural network in real time or at a speed faster than the real time.

However, in order to implement higher level functions, such as a recognition function, using the silicon neural network, it is necessary to integrate a large number of neurons into a single chip or multi-chips. Here, the neuron means a cell constituting a neuro system. The functions of the neuron are specific to information processing and information communication, and are unique to animals.

In order to integrate a large number of neurons into a single chip or multi-chips, the improvement of the degree of integration, the reduction of power consumption, the improvement of temperature stability, the robustness against manufacturing variations, and the like toward practical use are required. The robustness means the improvement of an inner mechanism for blocking changes due to influences of external disturbances, such as the change of stress and the change of an environment.

It is known that, in many cases, an ion channel of a neuronal cell has a sigmoid function-like characteristic in response to a membrane potential or the like. The sigmoid function is a function used in a mathematical model of a neural activity, and the like. As a specific example of such a phenomenon in which the ion channel of the neuronal cell has a sigmoid function-like characteristic in response to the membrane potential or the like, a Hodgkin-Huxley model, a standard neuron ignition model, is known.

In the Hodgkin-Huxley model, it is shown that, when activation variables of a sodium ion channel are denoted by m and h, and an activation variable of a potassium ion channel is denoted by n, it can be seen that the change of these activation with respect to the membrane potential changes as a sigmoid function-like changes, such as illustrated in FIG. 1. FIG. 1 is a diagram illustrating changes in response to a membrane potential for various activation variables in the Hodgkin-Huxley model, which is a standard neuron ignition model. In silicon neural network circuits, a circuit having a sigmoid function-like input/output characteristic plays a fundamental role.

Here, the sigmoid function is a function having a nonlinear input/output characteristic represented by the following numerical expression.

$$f_{sig}(x) = \frac{1}{1+e^{\frac{(x_0-x)}{x_s}}}$$ Numerical Expression 1

Further, "sigmoid function-like" means "having a nonlinear characteristic like the sigmoid function". For example, a function obtained by the exponentiation of the above function, such as ½ power of the above function, and represented by the following numerical expression is also referred to as "sigmoid function-like".

$$f_{sig\_like}(x) = \sqrt{\frac{1}{1+e^{\frac{(x_0-x)}{x_s}}}}$$ Numerical Expression 2

Further, not only the increasing function, but also a decreasing function is also referred to as "sigmoid function-like". Plotted graphs resulting from the representation of these functions by y=f(x) are illustrated in FIG. 2. FIG. 2 is a diagram illustrating a sigmoid function or sigmoid function-like functions. In FIG. 2, sign A indicates a sigmoid function; sign B indicates a sigmoid decreasing function; and sign C indicates the square root of the sigmoid function (sign A).

In Non Patent Literature 1, an element having, in its input/output, a sigmoid function-like characteristic, such as illustrated in FIG. 2, is used. Further, in Non Patent Literature 1, there is disclosed a technique that achieves a silicon neuron circuit, such as illustrated in FIG. 5, by combining a differential pair amplifier illustrated in FIG. 3, and a non-linear circuit achieved in a cascode circuit illustrated in FIG. 4.

In FIG. 5, circuit $f_v$ and circuit $g_v$ are circuits having a sigmoid function-like input/output characteristic. Circuit $f_v$ in FIG. 5 is implemented by the differential pair amplifier illustrated in FIG. 3, and circuit $g_v$ is implemented by the cascode circuit illustrated in FIG. 4. In FIG. 5, $I_{av}$ is a constant current source. Further, C is a capacitor and retains membrane potential V. Moreover, this silicon neuron circuit is capable of receiving stimulus current $I_{stim}$ from, for example, another neuron or the like. The silicon neuron circuit of FIG. 5 achieves the reduction of power consumption by suppressing the amount of current through the use of metal-oxide-semiconductor field effect transistors (MOSFETs) in a subthreshold region.

Further, as a circuit technique using noise, a stochastic logic gate is reported in Non Patent Literature 2, and the stochastic logic gate utilizes a phenomenon called a stochastic resonance. In FIG. 6, it is shown that individual potentials represented by a full line and a dashed line have mutually different stabilities. Each of the potentials illustrated in FIG. 6 is a dynamics system potential having two different stable states (α, β). It is disclosed that, when a sufficient amount of noise exists, in the potential represented by the dashed line, a staying probability at stable point β is larger than a staying probability at stable point α. Furthermore, in Patent Literature 1, there is disclosed a technique that achieves an annealing calculation by arbitrarily causing bit errors of static random access memory (SRAM).

LITERATURE OF THE PRIOR ART

Patent Documents

Patent Document 1: JP2016-051491A

Non-Patent Documents

Non-patent Document 1: T. Kohno and K. Aihara, "A qualitative-modeling-based low power silicon nerve membrane", International Conference on Electronics, Circuits and Systems, ICECS (2014).
Non-Patent Document 2: K. Murali, et al., "Reliable logic circuit elements that exploit nonlinearity in the Presence of a Noise Floor", Phys. Rev. Lett. 102, 104101 (2009).

SUMMARY OF INVENTION

Problem to be Solved by the Invention

The silicon neuron circuit is expected to be implemented in analog circuits having a small circuit size and small power consumption. Further, for the silicon neuron circuit, the improvement of the degree of integration and the further improvement of the efficiency of power are required. In general, however, for an analog circuit, a higher circuit accuracy than that of a digital circuit is required. In the analog circuit, therefore, manufacturing error tolerance of each element constituting the circuit is lower than in the digital circuit. Consequently, there is a problem in that it is difficult to manufacture the analog circuit using a highly integrated process, such as used in the digital circuit.

Moreover, it is known that, among the analog circuits, in particular, an analog circuit driven in a subthreshold region has a large temperature dependency. Nevertheless, integrated circuits, such as computer chips, are assumed to be used under various environments. It is desired, therefore, that the integrated circuits, such as computer chips, normally function within an utmost wide temperature range.

In view of the above problems, an object of the present invention is to provide a semiconductor device having a high degree of integration and high temperature resistance and intended to reduce power consumption.

Means for Solving the Problem

A semiconductor device according to the present invention includes an input means to which a voltage is applied, a current output means that outputs a high level current or a low level current in response to the voltage applied to the input means, and a stochastic circuit that, in response to the voltage applied to the input means, changes a probability that the high level current or the low level current is output from the current output means, in accordance with a sigmoid function used in a mathematical model of a neural activity.

Effect of the Invention

According to the present invention, a semiconductor device having a high degree of integration and high temperature resistance and intended to reduce power consumption can be provided.

BRIEF DESCRIPTION OF THE DRAWINGS

FIG. 6 is a diagram of an example illustrating a dynamics system potential having two different stable states
FIG. 9 is a diagram illustrating an example of the configuration of a stochastic circuit constituting a circuit having a sigmoid function-like input/output characteristic and included in a semiconductor device according to a first example embodiment.

BEST MODE FOR CARRYING OUT THE INVENTION

Hereinafter, example embodiments will be described with reference to the drawings.

Figure 1:
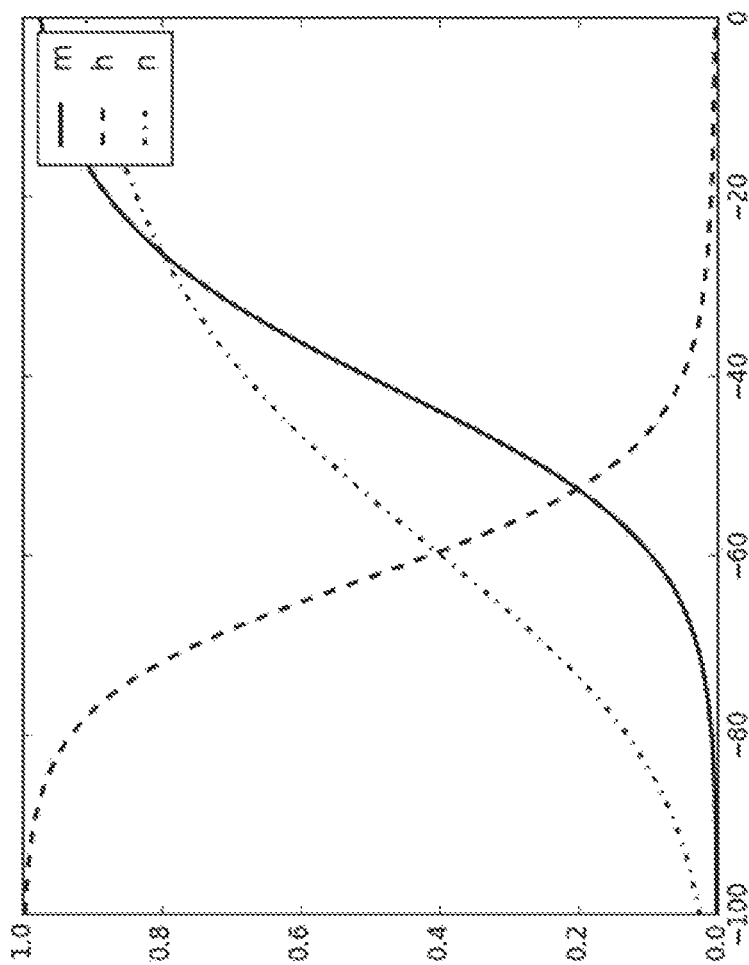
FIG. 1 is a diagram illustrating changes in response to a membrane potential for various activation variables in a Hodgkin-Huxley model, namely, a standard neuron ignition model.
Figure 2:
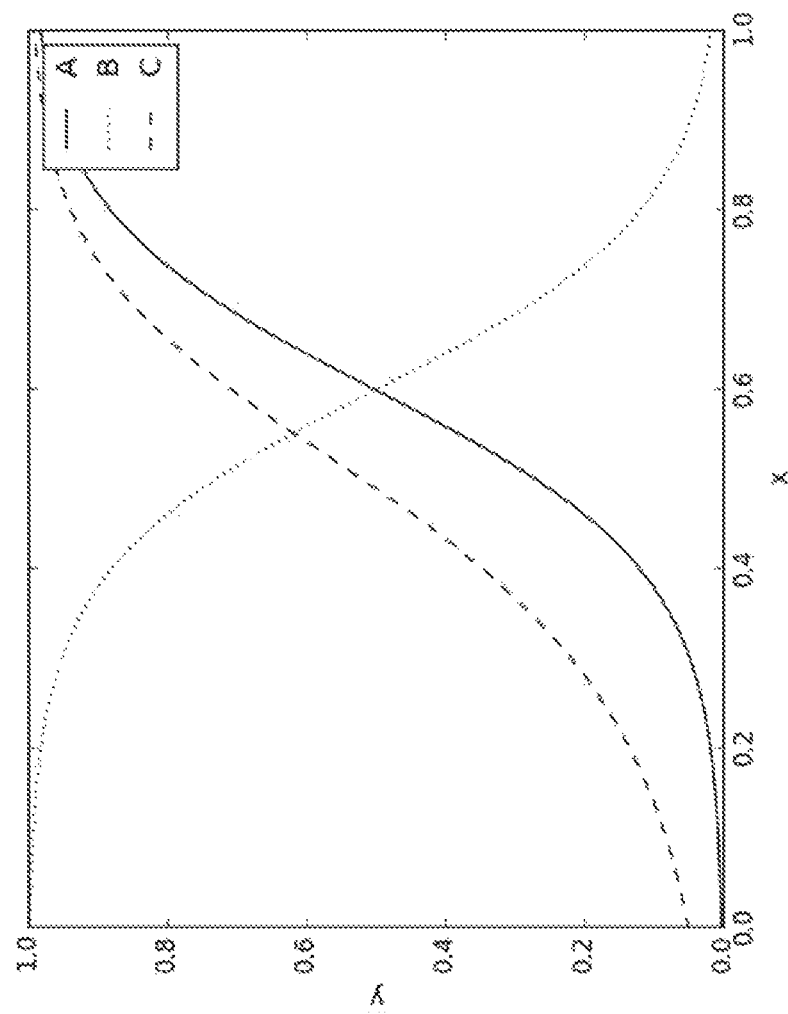
FIG. 2 is a diagram illustrating a sigmoid function and sigmoid function-like functions.
Figure 3:
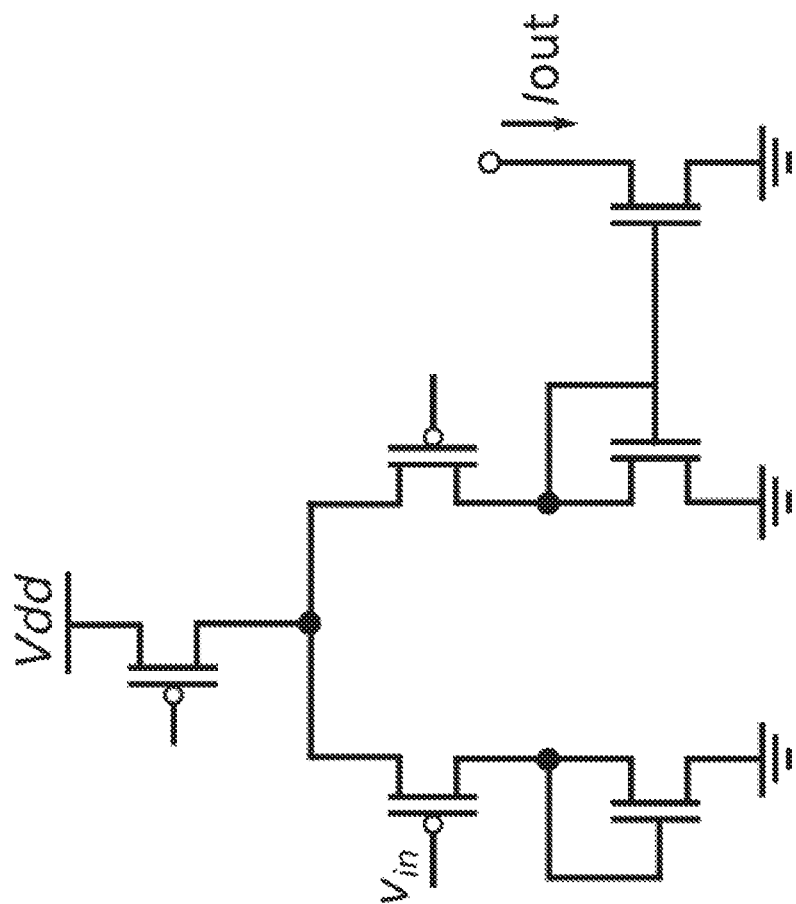
FIG. 3 is a diagram illustrating a nonlinear circuit (a differential amplifier), namely, a technique for implementing a silicon neuron circuit.
Figure 4:
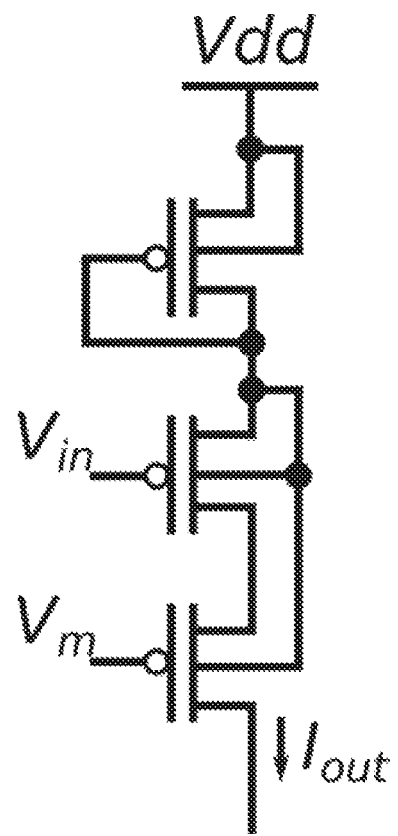
FIG. 4 is a diagram illustrating a nonlinear circuit (a cascode circuit), namely, a technique for implementing a silicon neuron circuit.
Figure 5:
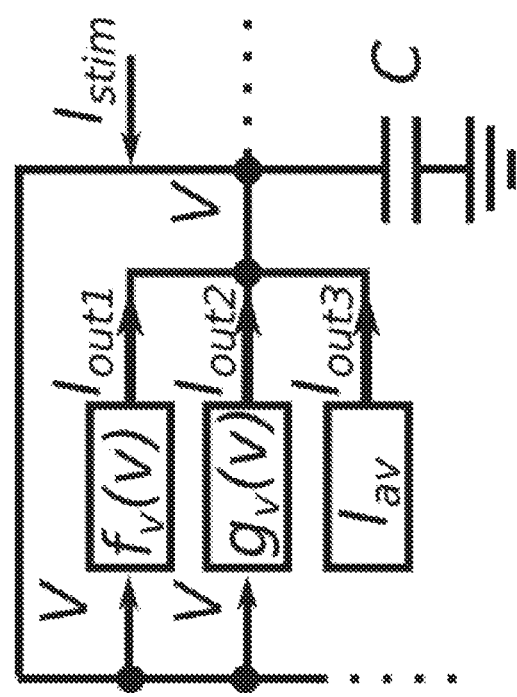
FIG. 5 is a diagram illustrating an example of techniques for implementing a silicon neuron circuit.
Figure 8:
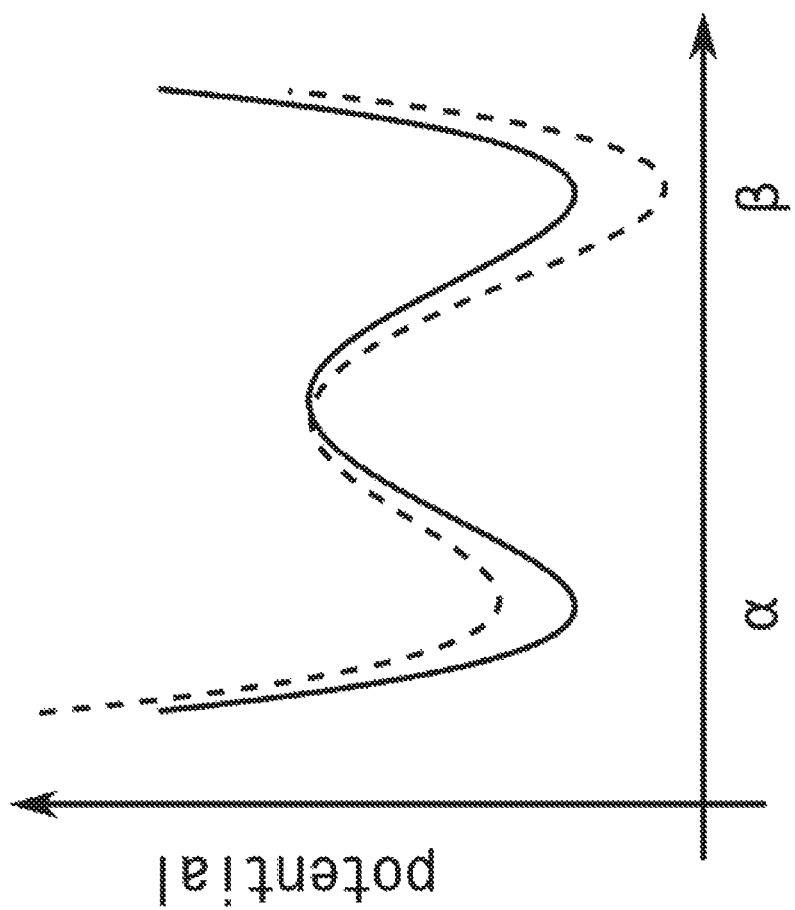
FIG. 8 is a diagram illustrating an example of an output current at the time when an input voltage is constant, in a circuit having a sigmoid function-like input/output characteristic and included in a semiconductor device according to an example embodiment.
Figure 7:
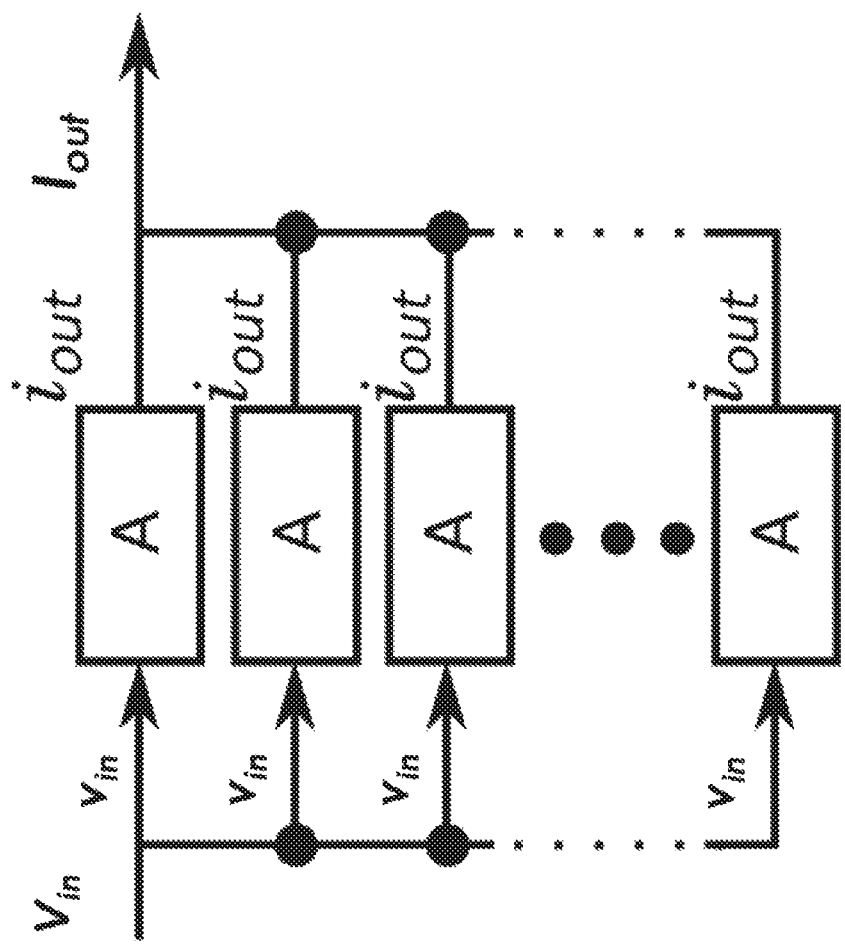
FIG. 7 is a diagram illustrating an example of the outline configuration of a circuit having a sigmoid function-like input/output characteristic and included in a semiconductor device according to an example embodiment.

Before the specific description of the example embodiments, a fundamental configuration for the present example embodiments will be described using FIGS. 7 and 8. FIG. 7 is a diagram illustrating an example of the outline configuration of a circuit having a sigmoid function-like input/output characteristic and included in a semiconductor device according to an example embodiment. FIG. 8 is a diagram illustrating an output current at the time when an input voltage is constant, in the circuit having a sigmoid function-like input/output characteristic and included in the semiconductor device according to the example embodiment.

As illustrated in FIG. 7, the circuit having a sigmoid function-like input/output characteristic and included in the semiconductor device according to the present example embodiment has a configuration in which one or more A circuits (hereinafter referred to as stochastic circuits A) are connected in parallel to input voltage $V_{in}$. Here, "stochastic" means "probabilistic".

Each stochastic circuit A outputs output current $i_{out}$ in response to input voltage $v_{in}$. As illustrated in FIG. 8, output current $i_{out}$ relative to time t in each stochastic circuit A becomes a magnitude $i_H$ or $i_L$. Each stochastic circuit A is defined as a circuit in which, in response to input voltage $v_{in}$, a probability that $i_H$ or $i_L$ of output current $i_{out}$ is output is increased or decreased with a sigmoid function-like.

Each stochastic circuit A, which are connected in parallel to input voltage $v_{in}$, operate independently. The output impedance of stochastic circuits A becomes sufficiently large or is designed in such a way as to also take finite output impedance into consideration. Output current $i_{out}$ of each stochastic circuit A is configured to be added so as to output total output current $I_{out}=i_{out}+i_{out}+i_{out}+\ldots+i_{out}$. Through the addition of output current $i_{out}$ of each stochastic circuit A, the circuit illustrated in FIG. 7 allows the reduction of noise due to probabilistic operation. Further, through the addition of output current $i_{out}$ of each stochastic circuit A, the circuit illustrated in FIG. 7 is capable of reducing the requirements for the temperature dependence and the circuit accuracy of an analog output. Moreover, stochastic circuit A has a CMOS (Complementary MOS) configuration. With this configuration, stochastic circuit A is configured to be capable of suppressing power consumption other than that at the time when output current $i_{out}$ is changed to an output level, such as $i_H$ or $i_L$.

First Example Embodiment (Structure)

Next, the configuration of a stochastic circuit constituting a semiconductor device according to a first example embodiment will be described. FIG. 9 is a diagram illustrating an example of the configuration of a stochastic circuit constituting a circuit having a sigmoid function-like input/output characteristic and included in the semiconductor device according to the first example embodiment. Stochastic circuit A has a configuration such as illustrated in FIG. 9. Stochastic circuit A includes circuit B (hereinafter referred to as bistable circuit B), a noise introduction unit that applies noise to bistable circuit B, and circuit C. As described later, circuit B has a stable state in which $V_H$ or $V_L$ is output as output voltage $V_{out}$. Further, output voltage $V_{out}$ is configured to transit between $V_H$ and $V_L$ states in response to noise applied from the noise introduction unit. Moreover, a probability that output voltage $V_{out}$ becomes $V_H$ or $V_L$ is configured to be capable of being controlled using external voltage (input voltage) $V_{in}$. Further, circuit C is a circuit that converts a voltage into a current.

(Operation)

Figure 10:
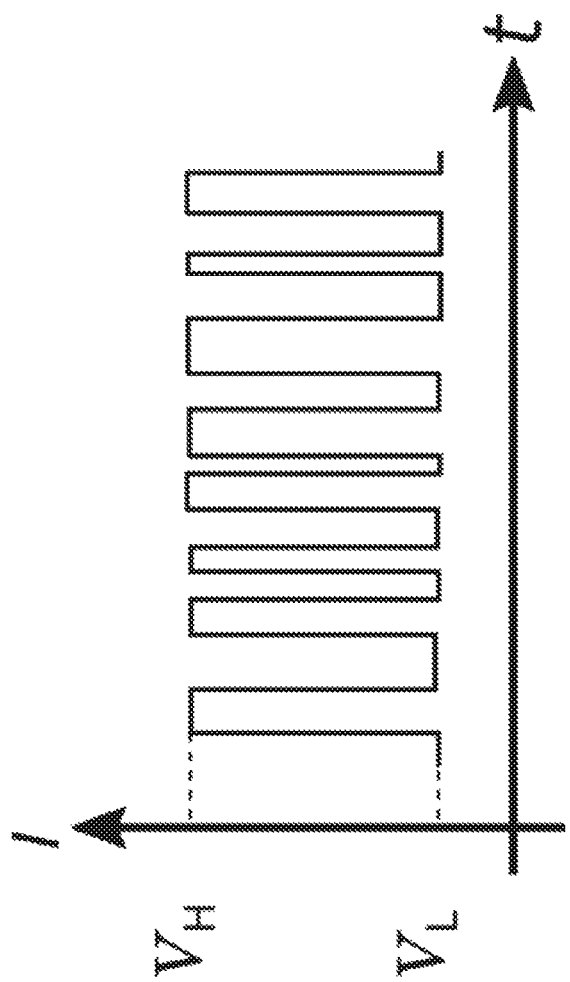
FIG. 10 is a diagram illustrating an example of an output voltage that is output in response to an input voltage of a bistable circuit of FIG. 9.

As illustrated in FIG. 10, output voltage $V_{out}$ of bistable circuit B relative to time t probabilistically outputs either voltage $V_H$ or $V_L$ in response to input voltage $V_{in}$. Circuit c converts a voltage having been output from circuit B into a current. When the output voltage is $V_H$ or $V_L$, circuit C outputs current $I_H$ or $I_L$.

The behavior of bistable circuit 8 can be represented by a dynamics system on the potential having been described in FIG. 6. The dynamics system can stably exist at one minimum value α or at the other one minimum value β. It is assumed that bistable circuit B outputs $V_H$ in state α and $V_L$ in state β. When noise is applied in this state, the behavior of bistable circuit B allows its state to transit from α to β or from β to α at a constant probability. When the potential of α has become relatively larger than the potential of β by the application of external voltage (input voltage) $V_{in}$, such as represented by a dashed line of FIG. 6, a state transition probability from α to β becomes lager than a state transition probability from β to α. Consequently, an existence probability of state β becomes large. By adopting such a nonlinear phenomenon as an operation principle, it becomes possible to change the probability that $V_H$ is output with respect to the input voltage $V_{in}$ to a nonlinear characteristic, such as the sigmoid function.

(Effect)

A characteristic (a nonlinear characteristic) in which, in response to input voltage $V_{in}$, a probability that output voltage $V_{out}$ is $V_H$ or $V_L$ is changed with a sigmoid function-like can be obtained.

Second Example Embodiment (Structure)

Figure 11:
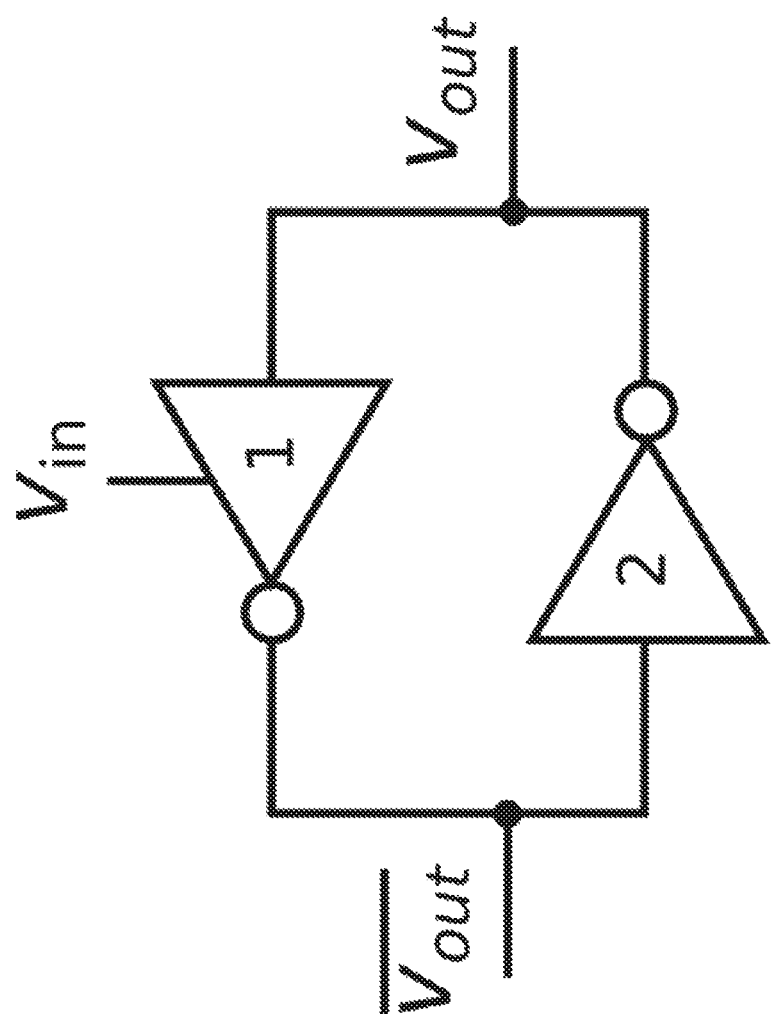
FIG. 11 is a diagram illustrating an example of the configuration of a stochastic circuit constituting a circuit having a sigmoid function-like input/output characteristic and included in a semiconductor device according to a second example embodiment.
Figure 12:
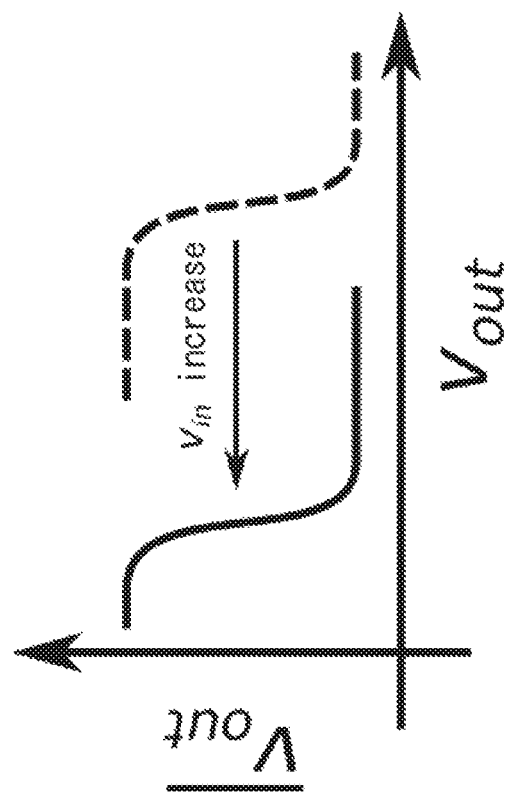
FIG. 12 is a diagram illustrating an input/output characteristic of an inverter of a flipflop circuit of FIG. 11.

Next, the configuration of a stochastic circuit constituting a semiconductor device according to a second example embodiment will be described. FIG. 11 is a diagram illustrating an example of the configuration of a stochastic circuit constituting a circuit having a sigmoid function-like input/output characteristic and included in the semiconductor device according to the second example embodiment. As illustrated in FIG. 11, bistable circuit B is configured by a flipflop circuit in which inverters are connected. By applying bias voltage (input voltage) $V_{in}$ to inverter 1 or inverter 1 and inverter 2, which is used in the flipflop circuit, the input/output characteristics of the inverters are changed, such as illustrated in FIG. 12. FIG. 12 is a diagram illustrating an input/output characteristic of the inverters constituting the flipflop circuit of FIG. 11.

(Operation)

Figure 13:
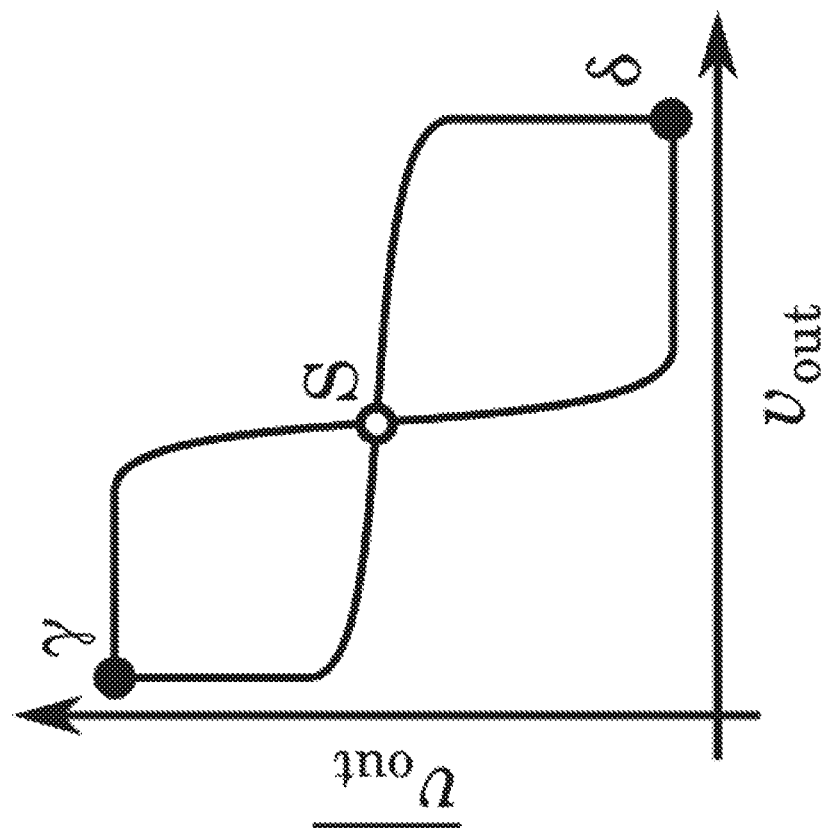
FIG. 13 is a diagram illustrating the flipflop circuit of FIG. 11 in a two-dimensional dynamics system.

The operation of the flipflop circuit of FIG. 11 can be understood by a two-dimensional dynamics system with $V_{out}$ and $V_{out}$ (NOT) as variables. The operation of the flipflop circuit can be understood by referring to a butterfly curve, such as illustrated in FIG. 13. FIG. 13 is a diagram illustrating the flipflop circuit of FIG. 11 with the two-dimensional dynamics system.

Two individual full lines in FIG. 13 illustrate an input/output characteristic of inverter 1 and an input/output characteristic of inverter 2. Cross points γ and δ of the two full lines are stable points, and cross point S is a saddle point. Here, the saddle point means a point that is a maximum value when seen from a certain direction and that is a minimum value when seen from another direction. Output voltage $V_{out}$ of stable point γ is Gnd (a ground voltage). Output voltage $V_{out}$ of stable point δ becomes $V_{dd}$ (a power supply voltage of the inverters).

A state in the vicinity of each stable point (γ, δ) becomes a state toward the each stable point. The larger a region in the vicinity of a stable point (γ, δ) is, the higher the stability at the stable point (γ, δ) is. The stability can be determined at, for example, the position of the saddle point (cross point S). The nearer the saddle point (cross point S) is located, the lower the stability is. By changing bias voltage (input voltage) $V_{in}$ of an inverter, the position of the saddle point (cross point S) can be changed. That is, by changing input voltage $V_{in}$, the stabilities of stable point γ and stable point δ can be changed. With this configuration, a probability that output voltage $V_{out}$ is output can be nonlinearly changed.

Figure 14:
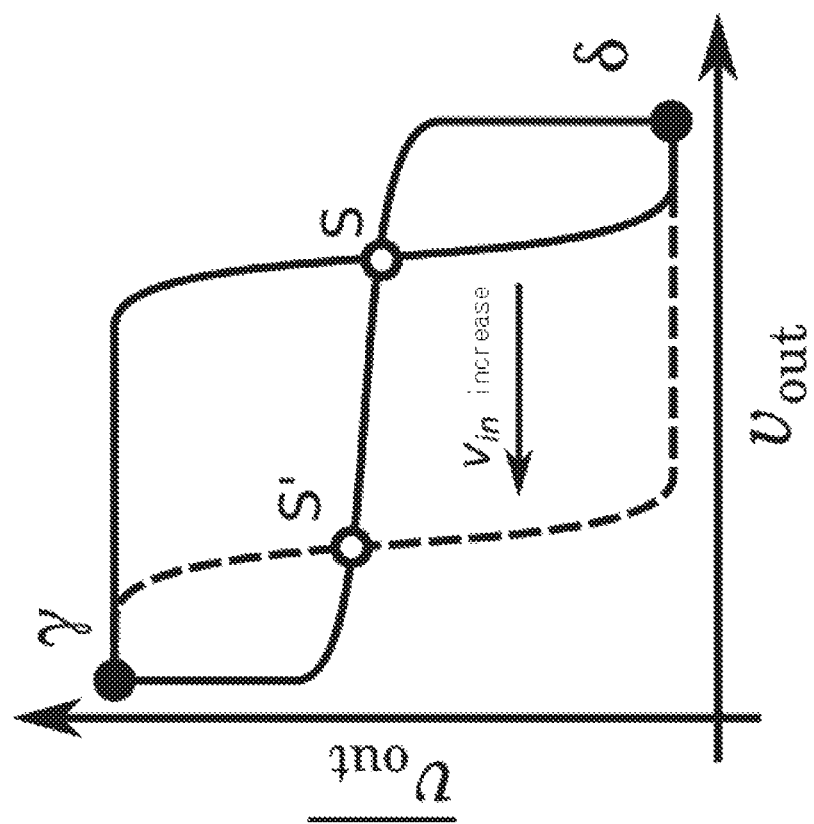
FIG. 14 is a diagram illustrating that the dynamics system of the flipflop circuit of FIG. 11 is changed.

As illustrated in FIG. 14, by increasing input voltage $V_{in}$, the input/output characteristic of inverter 1 is changed from a full line to a dashed line. Consequently, the saddle point (cross point S) of the input/output characteristics of two inverters 1 and 2 is changed to S'. With this change, the stability of stable point γ is decreased because stable point γ becomes near cross point (saddle point) S'. The stability of stable point δ is increased because stable point δ becomes far from cross point (saddle point) S'. Consequently, the more input voltage $V_{in}$ is increased, the more $V_{out}$ outputs $V_{dd}$ (the power supply voltage of the inverters). Further, a probability that $V_{out}$ outputs $V_{dd}$ in response to input voltage $V_{in}$ is increased with nonlinearity, such as that of the sigmoid function.

(Effect)

A characteristic (a nonlinear characteristic) in which, in response to input voltage $V_{in}$, a probability that output voltage $V_{out}$ outputs $V_{dd}$ is changed with a sigmoid function-like can be obtained.

Third Example Embodiment (Structure)

Figure 15:
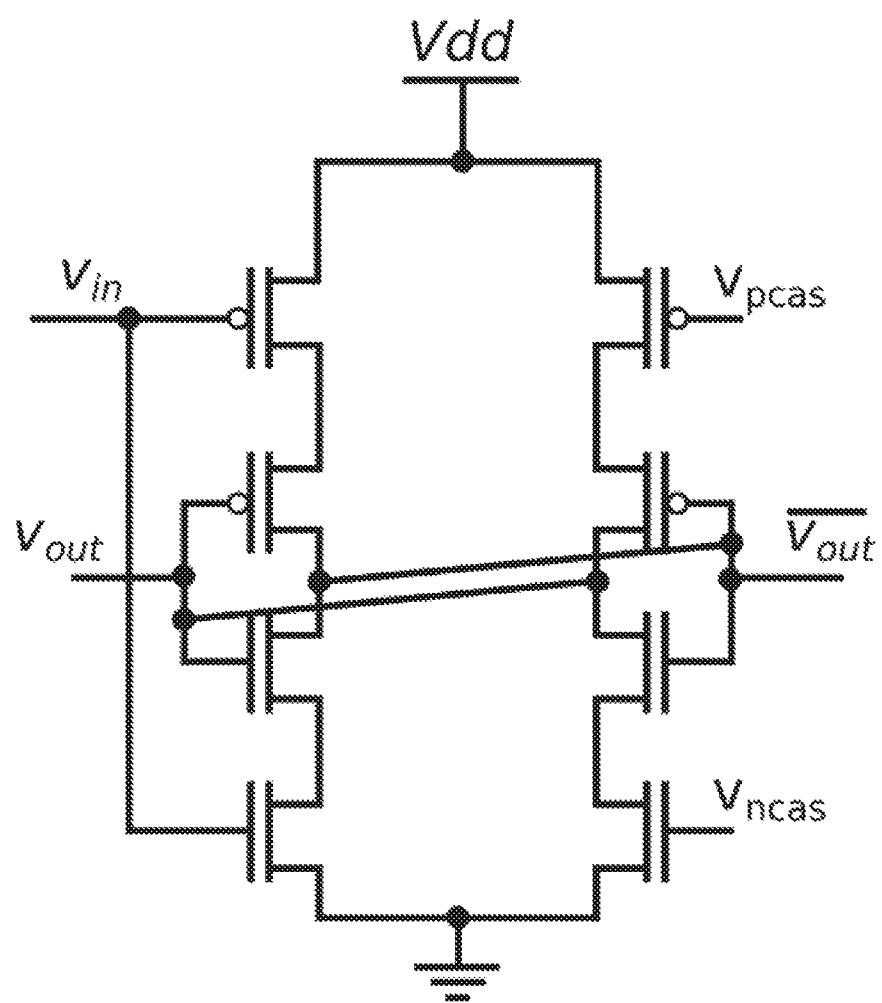
FIG. 15 is a diagram illustrating an example of the configuration of a bistable circuit constituting a circuit having a sigmoid function-like input/output characteristic and included in a semiconductor device according to a third example embodiment.

Next, the configuration of a stochastic circuit constituting a semiconductor device according to a third example embodiment will be described. FIG. 15 is a diagram illustrating an example of the configuration of a bistable circuit constituting a circuit having a sigmoid function-like input/output characteristic and included in the semiconductor device according to the third example embodiment. As illustrated in FIG. 15, bistable circuit B is configured using constant voltage source $V_{pcas}$ including a PMOS cascode and constant voltage source $V_{ncas}$ including an NMOS cascode.

(Operation)

When a power supply voltage is denoted by $V_{dd}$, output voltage $V_{out}$ is Gnd (a ground voltage) or $V_{dd}$ (a power supply voltage), and results in a stable state. Further, as output voltage $V_{out}$, Gnd (the ground voltage) or $V_{dd}$ (the power supply voltage) is probabilistically output by noise. Input voltage $V_{in}$ is directly connected to the bias input of one of invertors. Further, at this time, a probability that power supply voltage $V_{dd}$ is output is changed in response to input voltage $V_{in}$. The probability that power supply voltage $V_{dd}$ is output is nonlinearly increased with a sigmoid function-like in response to input voltage $V_{in}$.

(Effect)

A characteristic (a nonlinear characteristic) in which, in response to input voltage $V_{in}$, a probability that output voltage $V_{out}$ outputs $V_{dd}$ is changed with a sigmoid function-like can be obtained.

First Example

Figure 16:
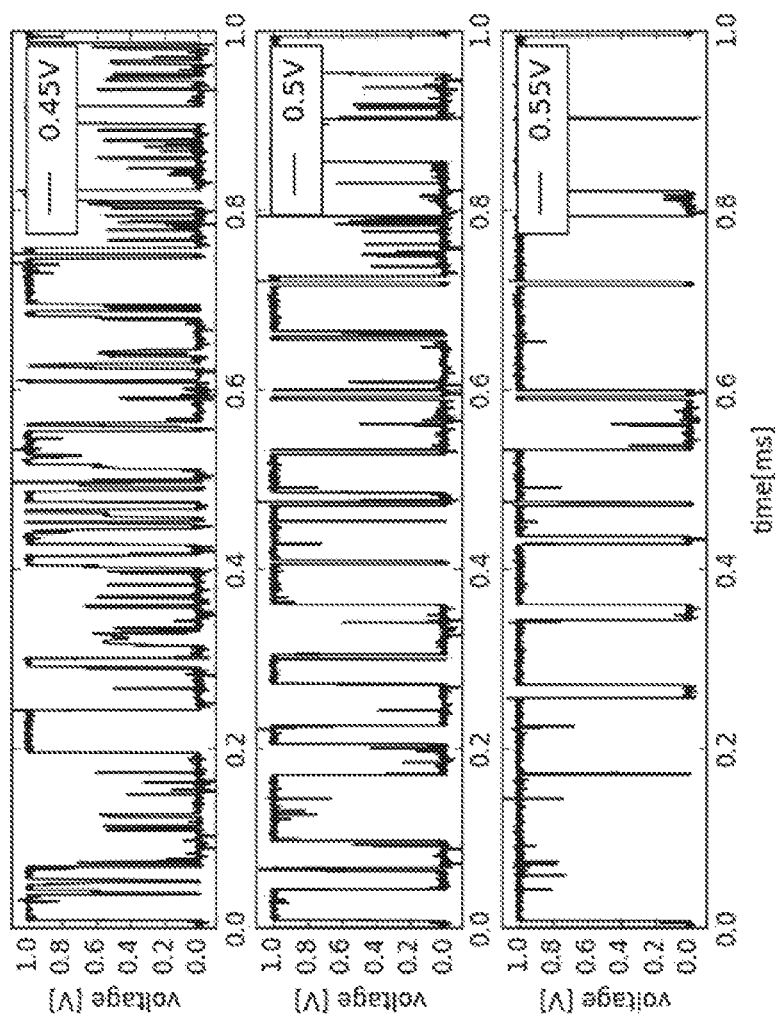
FIG. 16 is a diagram illustrating a simulation of an output voltage of a bistable circuit of FIG. 15 at the time when an input voltage of the bistable circuit is changed.

In FIG. 16, there is illustrated a simulation of the output voltage of the bistable circuit of FIG. 15 at the time when input voltage $V_{in}$ of the bistable circuit is changed. The conditions for the simulation are such that power supply voltage $V_{dd}$=1 V, and when input voltage $V_{in}$ is changed within a range from 0 V to 1 V, the changes of output voltage $V_{out}$ relative to a time axis are obtained. Further, output voltages $V_{out}$ at the times when input voltage $V_{in}$ reaches approximately middle points within a range from 0 V to 1 V, namely, three points (0.45 V, 0.5 V, and 0.55 V) at which a state in which output voltage $V_{out}$ is rapidly changed within the range from 0 V to 1 V is significant are simulated using a circuit simulator Spectre, a product of Cadence company.

It can be observed that a status in which a probability that output voltage $V_{out}$ is 1 V is largely changed because of the nonlinearity of the bistable circuit, within a range, relative to a central diagram of FIG. 16, for which input voltage $V_{in}$ is 0.5 V, from −0.05 V ($V_{in}$=0.45 V) (an upper diagram) to +0.05 V ($V_{in}$=0.55 V) (a lower diagram).

Figure 17:
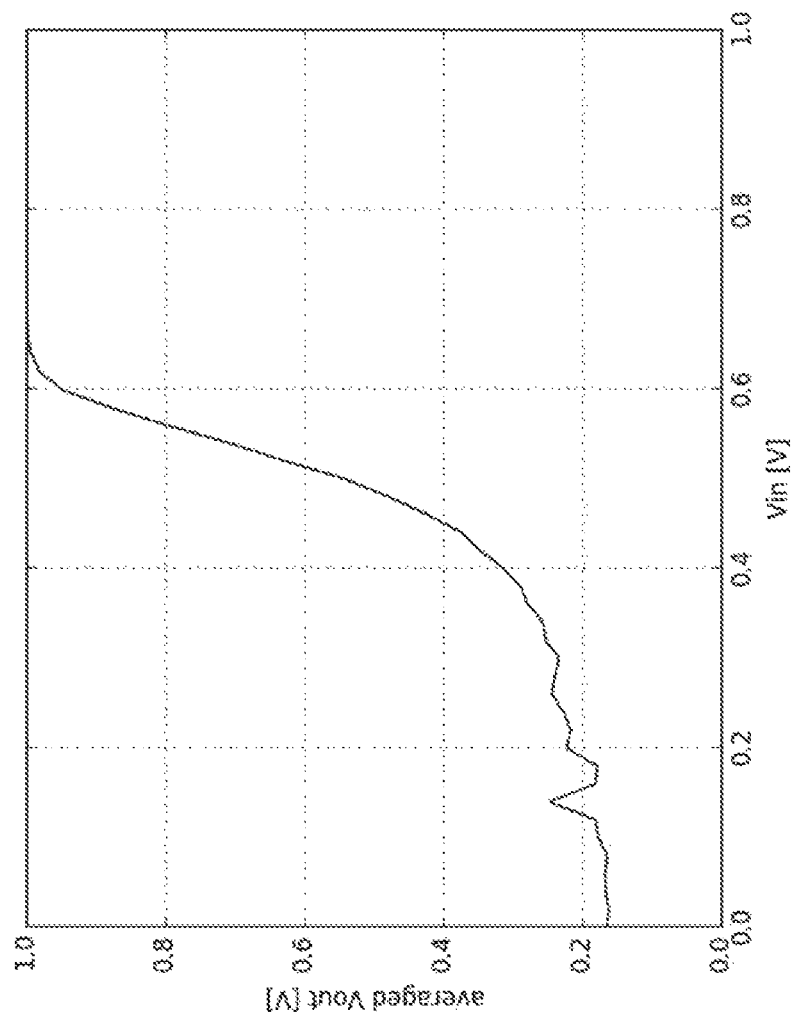
FIG. 17 is a diagram illustrating an average value of an output voltage of a bistable circuit of FIG. 15 at the time when an input voltage of the bistable circuit is changed.

Further, there is illustrated in FIG. 17 in which its horizontal axis corresponds to input voltage $V_{in}$, and its vertical axis corresponds to an average value of output voltage $V_{out}$ of the bistable circuit of FIG. 15 at the time when input voltage $V_{in}$ of the bistable circuit is changed. It can be understood that the average value of output voltage $V_{out}$ has nonlinearity with a sigmoid function-like in response to input voltage $V_{in}$.

Figure 18:
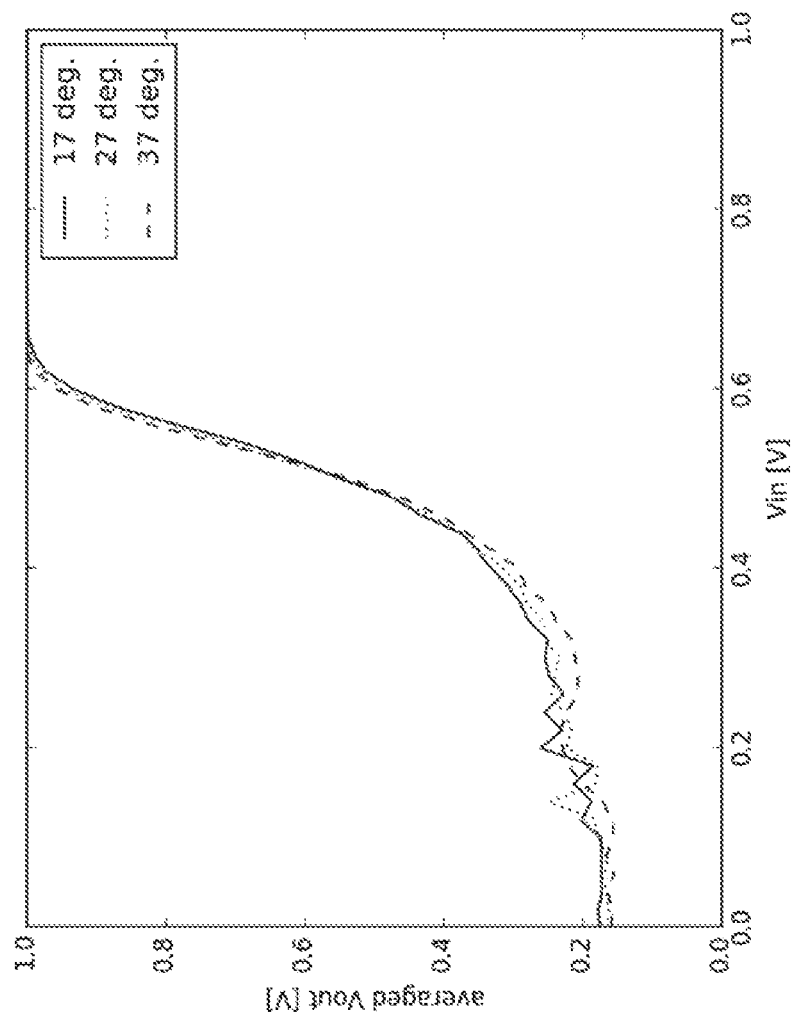
FIG. 18 is a diagram illustrating temperature dependency of an average value of an output voltage of a bistable circuit of FIG. 15 at the time when an input voltage of the bistable circuit is changed.

Moreover, there is illustrated in FIG. 18 in which its horizontal axis corresponds to input voltage $V_{in}$, and its vertical axis corresponds to an average value of output voltage $V_{out}$, the average value being represented as a temperature characteristic at the time when input voltage $V_{in}$ of the bistable circuit of FIG. 15 is changed. In FIG. 18, a full line represents a change at 17° C.; a dotted line represents a change at 27° C.; and a dashed line represents a change at 37° C. As understood from FIG. 18, the average value of output voltage $V_{out}$ is scarcely changed even the temperature is changed.

Through this presentation, it can be understood that the bistable circuit has high temperature stability.

Fourth Example Embodiment (Structure)

Figure 19:
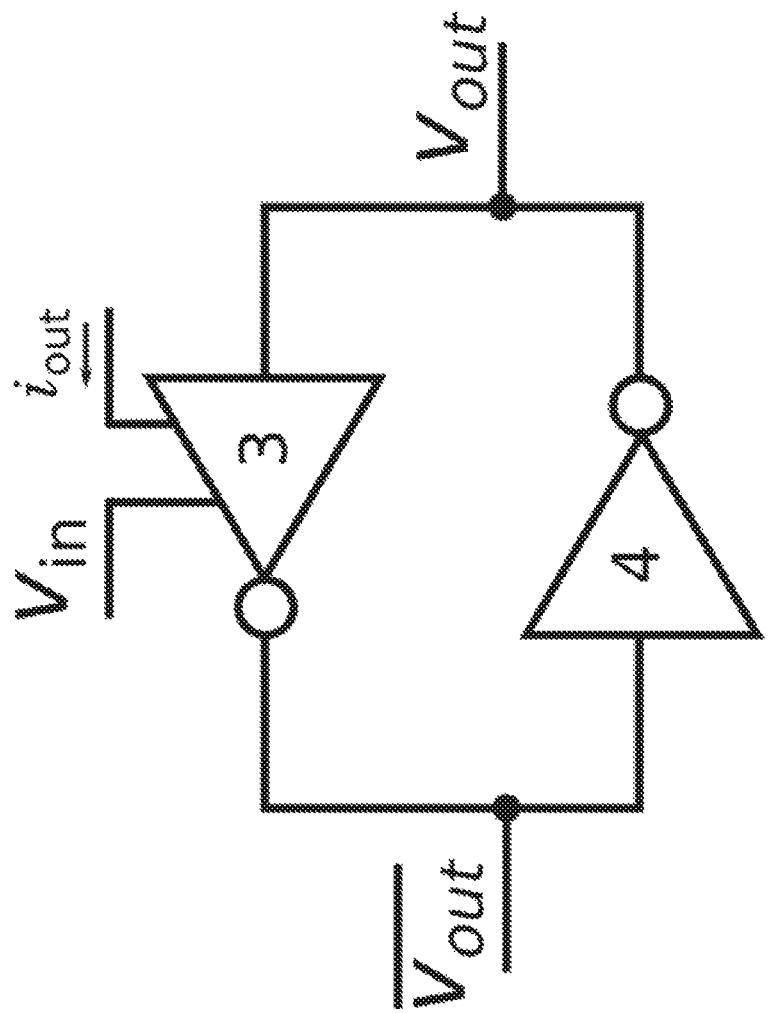
FIG. 19 is a diagram illustrating an example of the configuration of a stochastic circuit constituting a circuit having a sigmoid function-like input/output characteristic and included in a semiconductor device according to a fourth example embodiment.

Next, the configuration of a stochastic circuit constituting a semiconductor device according to a fourth example embodiment will be described. FIG. 19 is a diagram illustrating an example of the configuration of a stochastic circuit constituting a circuit having a sigmoid function-like input/output characteristic and included in the semiconductor device according to the fourth example embodiment, the stochastic circuit is configured by a flipflop circuit in which inverters are connected. By applying bias voltage (input voltage) $V_{in}$ to inverter 3, or inverter 3 and inverter 4, the characteristics of the inverters are changed. Moreover, the flipflop circuit is configured to allow inverter 3, inverter 4, or both of inverters 3 and 4 to, in each of two stable states of the flipflop, cause output current $i_{out}$ dependent on the stable state. In FIG. 19, there is illustrated a configuration, as an example, in which both of input voltage $V_{in}$ and output current $i_{out}$ are connected to inverter 3.

(Operation)

Figure 20:
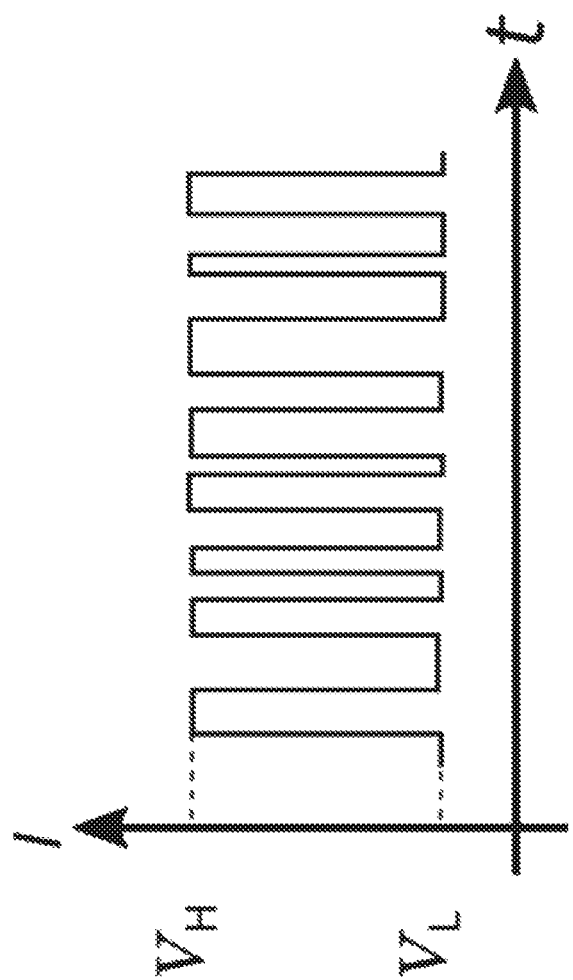
FIG. 20 is a diagram illustrating an example of an output voltage that is output in response to an input voltage of a bistable circuit of FIG. 19.
Figure 21:
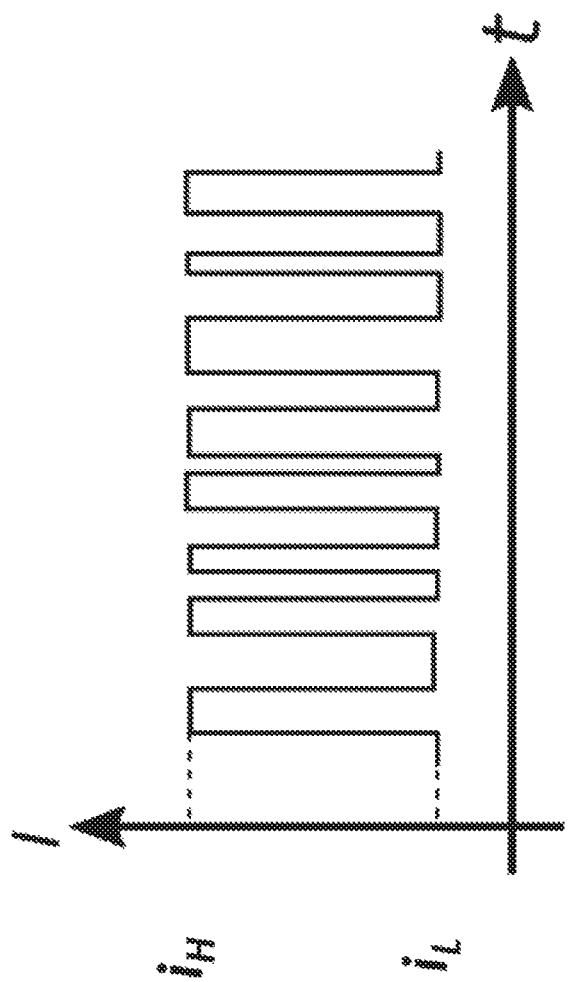
FIG. 21 is a diagram illustrating an example of an output current that is output in response to an input voltage of a bistable circuit of FIG. 19.

The state of the flipflop circuit of FIG. 19 can be understood, just like the second example embodiment, with the two-dimensional dynamics system in which $V_{out}$ and $V_{out}$ (NOT) are handled as variables and which has stable points (γ, δ) and a saddle point (S) as illustrated in FIG. 13. Further, just like the second example embodiment, by changing bias voltage (input voltage) $V_{in}$, the input/output characteristic of the inverters is changed. That is, by changing the position of saddle point S in the dynamics system, the stabilities of stable point γ and stable point δ can be changed. With this configuration, when placed under a noise environment, this flipflop circuit transits between stable point γ and stable point δ, and as a result, output voltage $V_{out}$ probabilistically indicates low voltage $V_L$ (=Gnd) and high voltage $V_H$ (=$V_{dd}$), such as illustrated in FIG. 20. Further, when $V_{out}$ is the high voltage or the low voltage, output current $i_{out}$ outputs current $i_H$ or $i_L$, and thus, as a result, output current $i_{out}$ probabilistically outputs low current value $i_L$ and high current value $i_H$, such as illustrated in FIG. 21. Moreover, by input voltage $V_{in}$, a probability of staying at each stable point can be nonlinearly changed with a sigmoid function-like.

(Effect)

By utilizing a current for driving the inverters as an output current, the power consumption can be reduced.

Fifth Example Embodiment (Structure)

Figure 22:
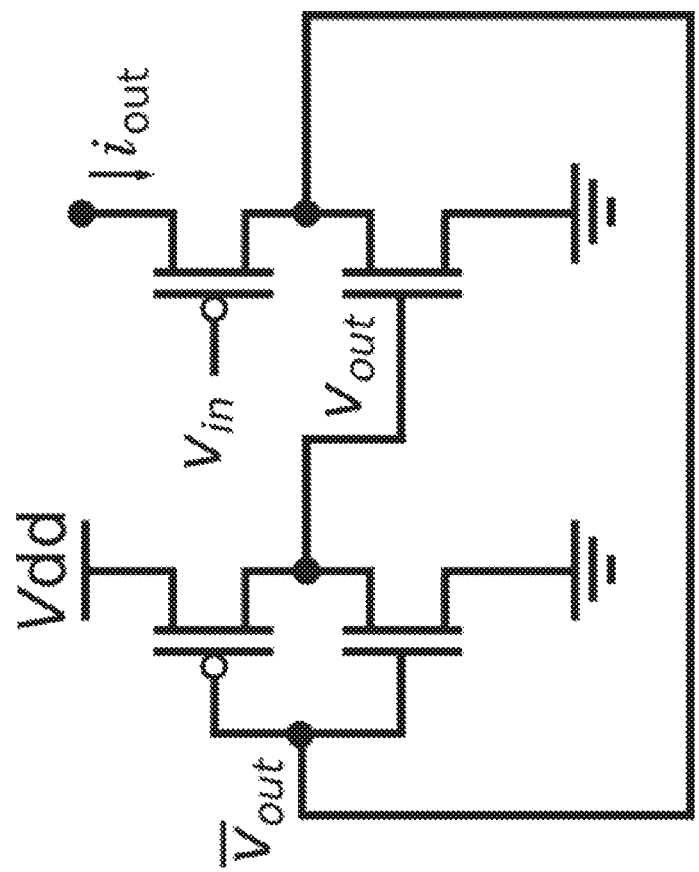
FIG. 22 is a diagram illustrating an example of the configuration of a stochastic circuit constituting a circuit having a sigmoid function-like input/output characteristic and included in a semiconductor device according to a fifth example embodiment.

Next, the configuration of a stochastic circuit constituting a semiconductor device according to a fifth example embodiment will be described. FIG. 22 is a diagram illustrating an example of the configuration of a stochastic circuit constituting a circuit having a sigmoid function-like input/output characteristic and included in the semiconductor device according to the fifth example embodiment, the stochastic circuit is configured by a flipflop circuit in which inverters are connected. One of the inverters is configured to allow an input voltage to be applied to its PMOS. An output current arises as an output current of the above inverter.

(Operation)

When $V_{out}$ and $V_{out}$ (NOT) are respectively Gnd and $V_{dd}$, which are stable points, output current $i_{out}$ is very low; while, when $V_{out}$ and $V_{out}$ (NOT) are respectively $V_{dd}$ and Gnd, which are stable points, output current $i_{out}$ is high. When placed under a noise environment, this flipflop circuit transits between these two stable points, and a probability that $V_{out}$ indicates $V_{dd}$ is changed with a sigmoid function-like by input voltage $V_{in}$. Consequently, average output current $i_{out}$ is changed with a sigmoid function-like by input voltage $V_{in}$.

(Effect)

By utilizing a current for driving the inverters as an output current, the power consumption can be reduced.

Second Example

Figure 23:
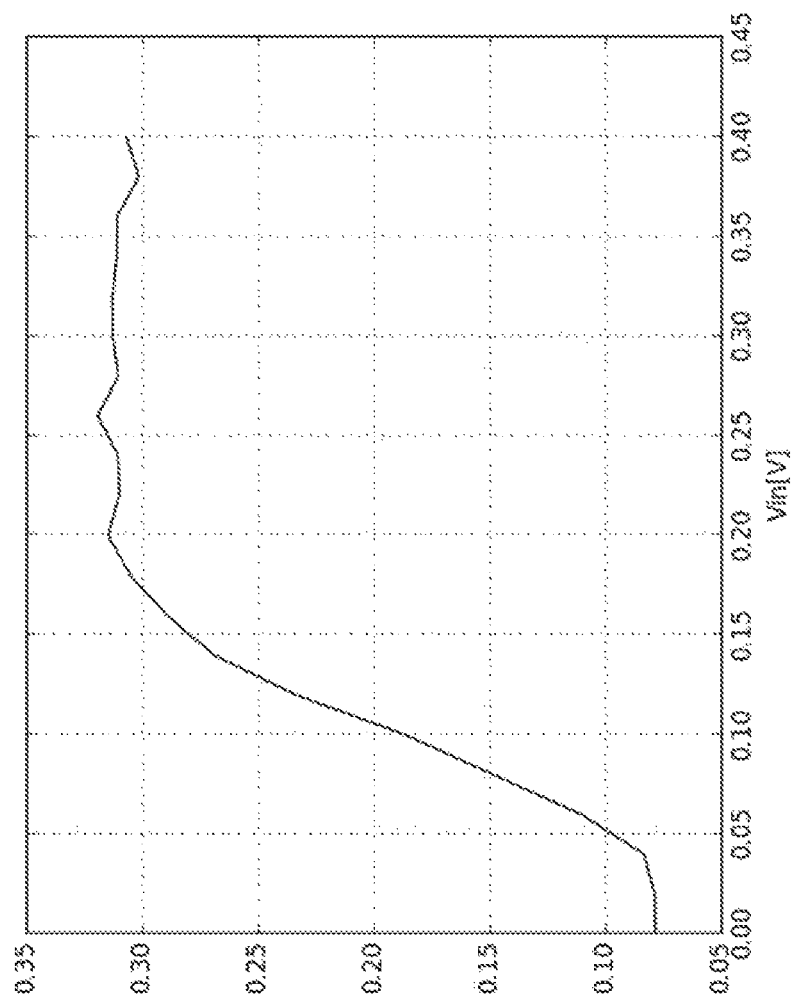
FIG. 23 is a diagram illustrating a result of the simulation of an average value of an output voltage of a bistable circuit of FIG. 22 at the time when an input voltage of the bistable circuit is changed.

In FIG. 23, there is illustrated a simulation of an average output voltage of the bistable circuit of FIG. 22 at the time when input voltage $V_{in}$ of the bistable circuit is changed. The condition for the simulation is such that power supply voltage $V_{dd}$=0.4 V.

Output current results in the product of a probability that output voltage $V_{out}$ indicates $V_{dd}$ and an amount of leak current, and thus, by taking into consideration an influence exerted on input voltage $V_{in}$ by the leak current, a sigmoid function-like input/output characteristic can be obtained.

Sixth Example Embodiment (Structure)

Figure 24:
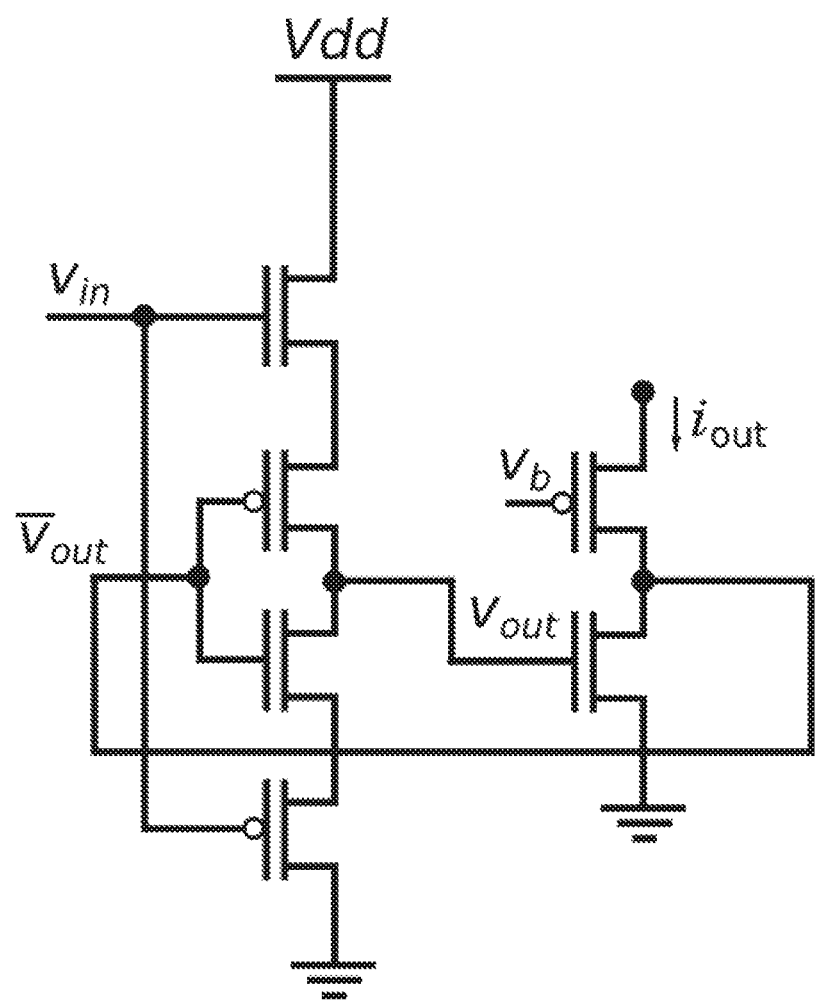
FIG. 24 is a diagram illustrating an example of the configuration of a stochastic circuit constituting a circuit having a sigmoid function-like input/output characteristic and included in a semiconductor device according to a sixth example embodiment.

Next, the configuration of a stochastic circuit constituting a semiconductor device according to a sixth example embodiment will be described. FIG. 24 is a diagram illustrating an example of the configuration of a stochastic circuit constituting a circuit having a sigmoid function-like input/output characteristic and included in the semiconductor device according to the sixth example embodiment, the stochastic circuit is configured by a flipflop circuit in which inverters are connected. Input voltage $V_{in}$ and output current $i_{out}$ are each connected to different inverters, respectively and bias voltage $V_b$ for adjusting the magnitude of output current $i_{out}$ is connected to the gate voltage of PMOS of an inverter through which output current $i_{out}$ flows.

(Operation)

$V_{out}$ probabilistically indicates Gnd or $V_{dd}$ by noise, and when $V_{out}$ indicates $V_{dd}$, output current $i_{out}$ becomes high. Further, a probability that $V_{out}$ indicates $V_{dd}$ is changed with a sigmoid function-like by changing the stability of the flipflop circuit using input voltage $V_{in}$. Further, the magnitude of output current $i_{out}$ is adjusted by bias voltage $V_b$.

(Effect)

By utilizing a current for driving the inverters as an output current, the power consumption can be reduced. Further, any sigmoid function-like input/output characteristic can be obtained because a probability that the output current becomes high can be changed by the input voltage and further the magnitude of the output current can be changed by bias voltage $V_b$.

Seventh Example Embodiment

Figure 25:
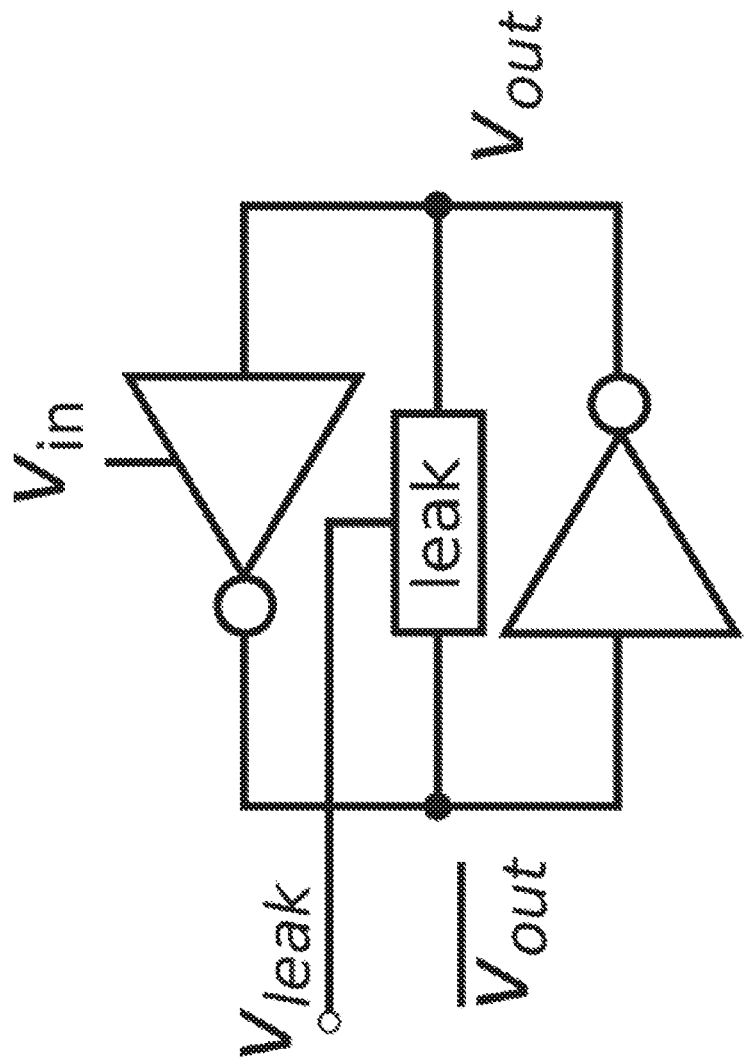
FIG. 25 is a diagram illustrating an example of the configuration of a stochastic circuit consisting a circuit having a sigmoid function-like input/output characteristic and included in a semiconductor device according to a seventh example embodiment.

Next, the configuration of a stochastic circuit constituting a semiconductor device according to a seventh example embodiment will be described. FIG. 25 is a diagram illustrating an example of the configuration of a stochastic circuit having a sigmoid function-like input/output characteristic and included in the semiconductor device according to the seventh example embodiment. As illustrated in FIG. 25, the present example embodiment has a configuration in which leak element (leak) is connected to a flipflop circuit in such a way as to interconnect $V_{out}$ and $V_{out}$ (NOT). Further, leak element leak is configured to be capable of adjusting the magnitude of the leak current using leak adjustment voltage $V_{leak}$.

(Operation)

When a leak current by leak element leak arises, the stability of the flipflop circuit is decreased, and thus, the probabilities of transitions between stable points (γ, δ), such as illustrated in FIG. 13, by noise become large.

(Effect)

The transition probabilities between stable points depend on the magnitude of noise, but the transition probabilities between stable points can be changed by leak adjustment voltage $V_{leak}$. Accordingly, it becomes possible to operate the transition probabilities between stable points constant under various noise conditions.

Eighth Example Embodiment (Structure)

Figure 26:
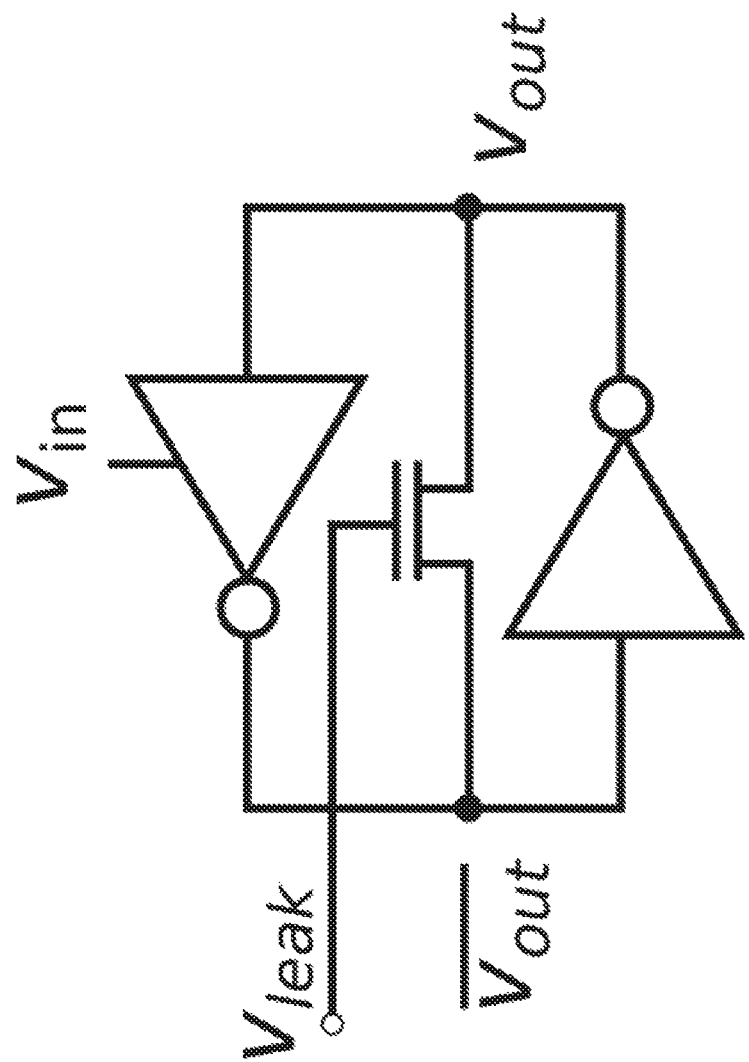
FIG. 26 is a diagram illustrating an example of the configuration of a stochastic circuit consisting a circuit having a sigmoid function-like input/output characteristic and included in a semiconductor device according to an eighth example embodiment.

Next, the configuration of a stochastic circuit constituting a semiconductor device according to an eighth example embodiment will be described. FIG. 26 is a diagram illustrating an example of the configuration of a stochastic circuit constituting a circuit having a sigmoid function-like input/output characteristic and included in the semiconductor device according to the eighth example embodiment. As illustrated in FIG. 26, the present example embodiment has a configuration in which leak element leak used in the above configuration of the seventh example embodiment is implemented by a MOSFET.

(Operation)

When the leak element is an NMOS, a leak current flowing through the NMOS is increased as leak adjustment voltage $V_{leak}$ is increased. As a result, the stability of the flipflop becomes worse, and the probabilities of transitions between the two stable states become large.

(Effect)

Resistance to noise can be adjusted by leak adjustment voltage $V_{leak}$, and thus, the circuit can be driven under various noise conditions.

Third Example

Figure 27:
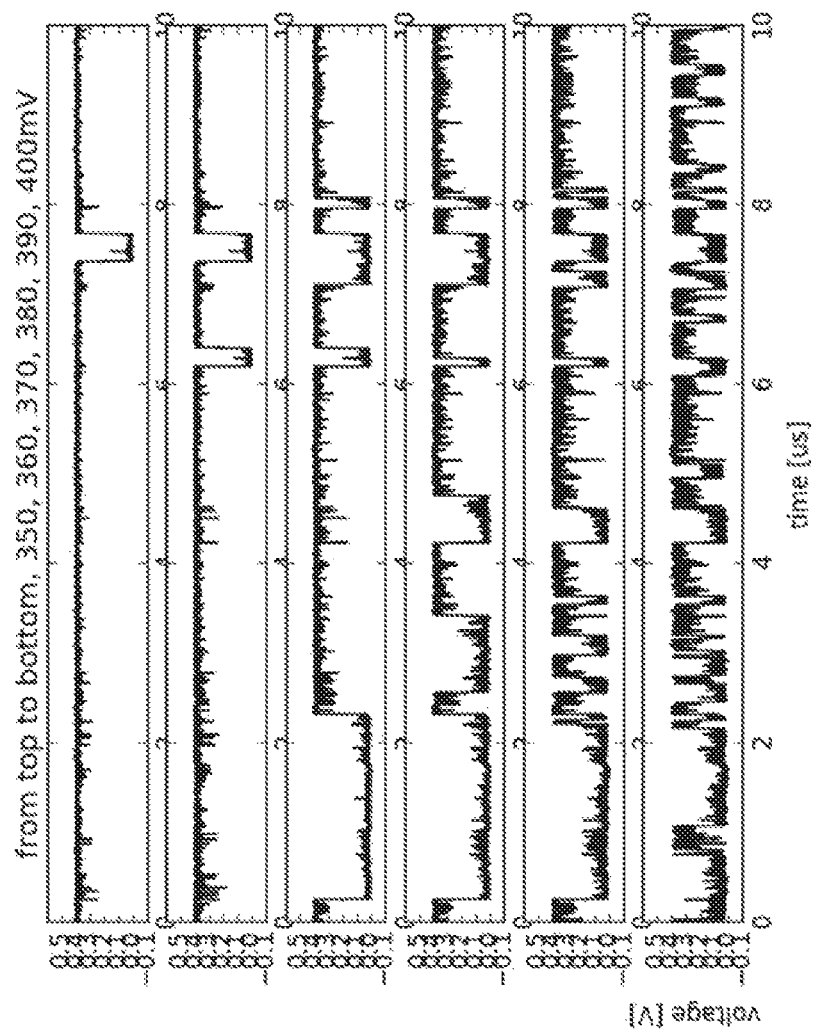
FIG. 27 is a diagram illustrating a simulation of an output voltage of a bistable circuit of FIG. 26 in various leak adjustment voltages $V_{leak}$ of the bistable circuit.

In FIG. 27, there is illustrated a result of a simulation of output voltage $V_{out}$ at the time when leak adjustment voltage $V_{leak}$ is changed from 350 mV to 400 mV. The simulation condition is such that power supply voltage $V_{dd}$=0.4 V. It can be understood that probabilities that output voltage $V_{out}$ transits between 0 V and 0.4 V are increased as leak adjustment voltage $V_{leak}$ is increased.

Ninth Example Embodiment (Structure)

Figure 28:
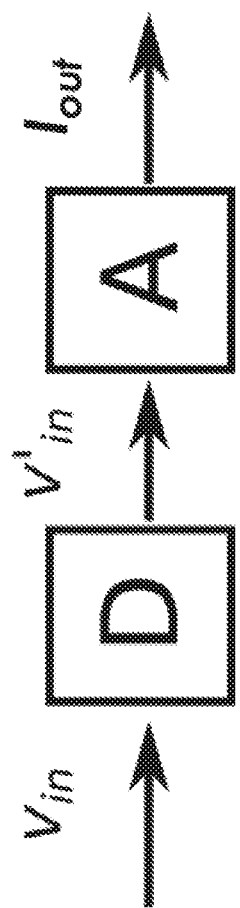
FIG. 28 is a diagram illustrating an example of the configuration in which circuit D that changes a sigmoid function-like input/output characteristic is inserted between an input voltage and a stochastic circuit of a semiconductor device according to an example embodiment.

Next, a configuration in which a circuit that changes a sigmoid function-like input/output characteristic is inserted between an input voltage and a stochastic circuit of a semiconductor device according to a ninth example embodiment will be described. FIG. 28 illustrates an example of the configuration in which circuit D that changes a sigmoid function-like input/output characteristic is inserted between input voltage $V_{in}$ and stochastic circuit A in FIG. 7, in which the fundamental configuration is illustrated. Input voltage $V_{in}$ is input to circuit D, and output voltage $V'_{in}$ of circuit D is input to stochastic circuit A.

(Operation)

Input voltage $V_{in}$ and output voltage $V'_{in}$ of circuit D (an input voltage of stochastic circuit A) have a relationship, such as numerical expression 3 described below.

$$v'_{in} = \alpha(v_{in} - \beta) \quad \text{Numerical Expression 3}$$

Note that $\alpha_0$ and $\beta_0$ are arbitrarily defined constants.

With this configuration, for example, an input/output characteristic of a sigmoid function in stochastic circuit A, such as numerical expression 4 described below, can be made a function of input voltage $V_{in}$ of circuit D, such as numerical expression 5 described below. Through this method, the shape of the sigmoid function can be changed.

$$i_{out} = \frac{1}{1 + e^{v'_{in}}} \quad \text{Numerical Expression 4}$$

$$i_{out} = \frac{1}{1 + e^{\alpha(v_{in} - \beta)}} \quad \text{Numerical Expression 5}$$

(Effect)

Various sigmoid function shapes can be implemented by inserting circuit D that changes a sigmoid function-like input/output characteristic, between input voltage $V_{in}$ and stochastic circuit A. For example, various silicon neuron circuits can be produced by implementing various sigmoid function shapes.

Tenth Example Embodiment (Structure)

Figure 29:
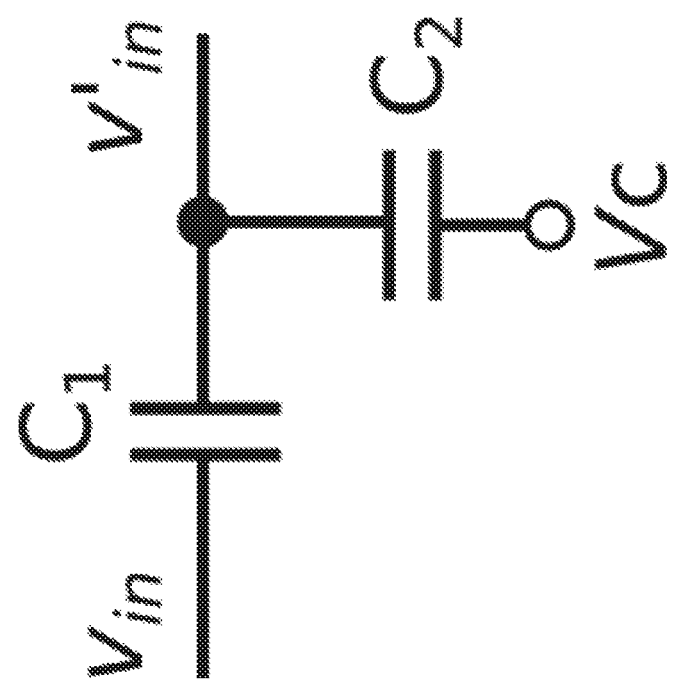
FIG. 29 illustrates an example of a circuit that is implemented at the input of a circuit having a sigmoid function-like input/output characteristic and included in a semiconductor device according to a tenth example embodiment.

Next, a circuit that is implemented at the input of a circuit having a sigmoid function-like input/output characteristic and included in a semiconductor device according to a tenth example embodiment will be described. FIG. 29 illustrates an example of a circuit that is implemented as circuit D having been described in the above ninth example embodiment, in such a way as to allow the input of capacitor $C_1$ to correspond to input voltage $V_{in}$ of circuit D, and allow the output of a voltage division circuit including capacitor $C_1$ and capacitor $C_2$ to correspond to input voltage $V'_{in}$ of stochastic circuit A.

(Operation)

Circuit D including capacitor $C_1$ and capacitor $C_2$ has a relationship between input voltage $V_{in}$ and output voltage $V'_{in}$ (the input voltage of stochastic circuit A), such as numerical expression 6 described below.

$$v'_{in} = \frac{C_1}{C_1 + C_2}\left(v_{in} + \frac{C_2}{C_1}V_C\right) \quad \text{Numerical Expression 6}$$

(Effect)

Circuit D is composed of a voltage dividing circuit using capacitors. Thus, power consumption loss along with the leak of a direct current can be reduced as much as possible. Further, the form of a circuit for the sigmoid function can be changed.

Eleventh Example Embodiment (Structure)

Figure 30:
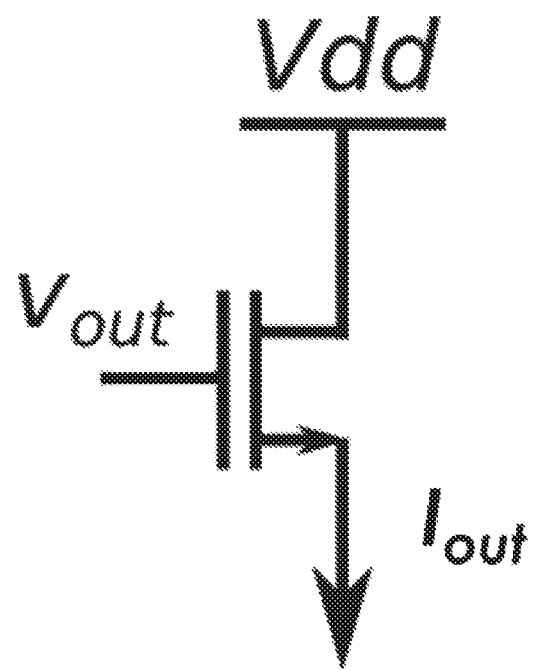
FIG. 30 is a diagram illustrating an example of the configuration of a stochastic circuit constituting a circuit having a sigmoid function-like input/output characteristic and included in a semiconductor device according to an eleventh example embodiment.

Next, the configuration of a stochastic circuit constituting a semiconductor device according to an eleventh example embodiment will be described. FIG. 30 illustrates an example of a circuit in which circuit C having been described in the above first example embodiment (FIG. 9) includes a MOSFET. Specifically, output voltage $V_{out}$ of bistable circuit B is connected to the gate terminal of the MOSFET; output current $I_{out}$ of circuit C is connected to the source terminal of the MOSFET; and power supply voltage $V_{dd}$ is connected to the drain terminal.

(Operation)

By making output voltage $V_{out}$ having been output from bistable circuit B a gate voltage of the MOSFET, when output voltage $V_{out}$ is power supply voltage $V_{dd}$, output current $I_{out}$ flows from the source terminal of the MOSFET. When output voltage $V_{out}$ is Gnd (the ground voltage), output current $I_{out}$ does not flow from the source terminal of the MOSFET.

(Effect)

Output voltage $V_{out}$ is an on/off signal of power supply voltage $V_{dd}$ and Gnd (the ground voltage). Thus, even though output current $I_{out}$ flowing through the MOSFET has no linearity relative to the gate voltage, output current $I_{out}$ dependent on an average voltage of output voltage $V_{out}$ can be obtained. This circuit can be implemented using a simple configuration.

Twelfth Example Embodiment

Figure 31:
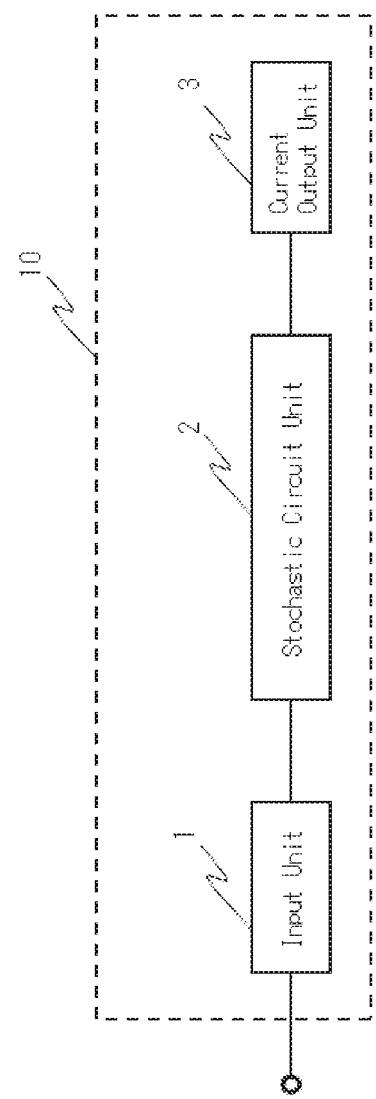
FIG. 31 is a diagram illustrating an example of the configuration of a semiconductor device according to a twelfth example embodiment.

Next, a configuration of a semiconductor device according to a twelfth example embodiment will be described. FIG. 31 is a diagram illustrating an example of the configuration of semiconductor device according to the twelfth example embodiment.

As illustrated in FIG. 31, semiconductor device 10 according to the present example embodiment includes input unit 1, stochastic circuit unit 2, and current output unit 3.

Input unit 1 is a unit to which a voltage is applied from the outside. Current output unit 3 is a unit that outputs a high level current ($i_H$) or a low level current ($i_L$) in response to the voltage applied to input unit 1. Stochastic circuit unit 2 is a unit that, in response to the voltage applied to input unit 1, changes a probability that the high level current ($i_H$) or the low level current ($i_L$) is output from current output unit 3, in accordance with a sigmoid function that is used in a mathematical model of a neural activity, and the like.

As described above, in the present example embodiments, bistable circuit B constituting stochastic circuit A has a digital circuit configuration in which output voltage $V_{out}$ transits between two stable states, such as a high level voltage ($V_H$) and a low level voltage ($V_L$). For this reason, a high degree of integration, which is a merit of digital circuits, can be achieved. Further, the temperature dependency can be eliminated, like the case of digital circuits. Moreover, stochastic circuit A has a CMOS configuration. With this configuration, power consumption can be further reduced, as compared with a bipolar transistor circuit.

Heretofore, the present invention has been described with reference to the example embodiments, but the present invention is not limited to the above example embodiments. In the configurations and the details of the present invention, various modifications understandable by those skilled in the art within the scope of the present invention can be made.

EXPLANATION OF REFERENCE NUMBERS

1 input unit
2 stochastic circuit unit
3 current output unit
10 semiconductor device
$V_{dd}$ power supply voltage
Gnd ground voltage
$V_{in}$, $v_{in}$ input voltage
$V_{out}$, $v_{out}$ output voltage
$I_{out}$, $i_{out}$ output current

What is claimed is:

1. A semiconductor device comprising:
   input means to which a voltage is applied;
   current output means that outputs a high level current or a low level current in response to the voltage applied to said input means; and
   a stochastic circuit that, in response to the voltage applied to said input means, changes a probability that the high level current or the low level current is output from said current output means, in accordance with a sigmoid function used in a mathematical model of a neural activity.

2. The semiconductor device according to claim 1, wherein
   said stochastic circuit includes:
   voltage output means that outputs a high level voltage or a low level voltage in response to the voltage applied to said input means; and
   noise applying means that, in response to the voltage applied to said input means, changes a probability that the high level voltage or the low level voltage is output from the voltage output
   means, in accordance with the sigmoid function.

3. The semiconductor device according to claim 2, wherein
   said stochastic circuit comprises a circuit in which an output of a first inverter and an input of a second inverter are connected to each other and an output of the second inverter and an input of the first inverter are connected to each other,
   the voltage applied to said input means is applied to a bias voltage of the first inverter,
   the high level voltage or the low level voltage that is output from the voltage output means is output from a connection line of the output of the second inverter and the input of the first inverter, and the probability that the high level voltage or the low level voltage is output from the voltage output means is changed in accordance with the sigmoid function in response to increasing or decreasing of the bias voltage of the first inverter.

4. The semiconductor device according to claim 1, wherein said stochastic circuit comprises a circuit in which an output of a third inverter and an input of a fourth inverter are connected to each other and an output of the fourth inverter and an input of the third inverter are connected to each other, the voltage applied to said input means is applied to a bias voltage of the third inverter, the high level current or the low level current is output from the third inverter or the fourth inverter, and the probability that the high level current or the low level current is output is changed in accordance with the sigmoid function in response to increasing or decreasing of the bias voltage of the third inverter.

5. The semiconductor device according to claim 3, wherein a leak element that is connected between a connection line of the output of the first inverter and the input of the second inverter and the connection line of the input of the first inverter and the output of the second inverter, and the semiconductor device further comprises voltage applying means capable of adjusting an amount of a leak current using the leak element.

6. The semiconductor device according to claim 1, further comprising a first circuit as said input means, wherein the semiconductor device has a relationship represented by Numerical expression 1 between voltage $V_{in}$ applied to said input means and voltage $V'_{in}$ applied to an input of said stochastic circuit, $$v'_{in} = \alpha(v_{in} - \beta) \qquad \text{Numerical Expression 1}$$

where $\alpha_0$ and $\beta_0$ are arbitrarily defined constants.

7. The semiconductor device according to claim 6, wherein the first circuit includes two capacitors connected in series, and voltage $V_{in}$ applied to said input means is applied to a first electrode of a first capacitor connected in series, and voltage $V'_{in}$ applied to the input of said stochastic circuit is output from a second electrode of the first capacitor and a first electrode of a second capacitor.

8. The semiconductor device according to claim 2, further comprising a second circuit connected to a posterior stage of said stochastic circuit and configured to convert the high level voltage or the low level voltage into the high level current or the low level current, wherein the second circuit is a field-effect transistor having a gate terminal to which the high level voltage or the low level voltage is applied, and a source terminal from which the high level current or the low level current is output.

9. The semiconductor device according to claim 1, wherein said stochastic circuit comprises a complementary metal-oxide-semiconductor (CMOS).

10. The semiconductor device according to claim 1, wherein a third circuit including said input means, said current output means, and said stochastic circuit is connected in parallel.

* * * * *